United States Patent [19]
Lat et al.

[11] Patent Number: 5,396,172
[45] Date of Patent: Mar. 7, 1995

[54] TRANSFORMER FAULT ANALYZER
[75] Inventors: Michael V. Lat, Mississauga; Thomas A. Gough, Etobicoke, both of Canada
[73] Assignee: Ontario Hydro, Toronto, Canada
[21] Appl. No.: 93,615
[22] Filed: Jul. 20, 1993
[51] Int. Cl.6 .............................................. G01R 1/04
[52] U.S. Cl. ................................................... 324/547
[58] Field of Search ....................... 324/547, 126-127, 324/55, 546

[56] References Cited
U.S. PATENT DOCUMENTS

| | | | |
|---|---|---|---|
| 1,901,701 | 3/1933 | Coffin | 324/127 |
| 1,992,013 | 2/1935 | Palueff | 177/311 |
| 2,125,124 | 7/1938 | Pratt | 175/183 |
| 2,481,198 | 9/1949 | Caldwell | 175/183 |
| 2,527,568 | 10/1950 | Murray | 175/183 |
| 2,910,646 | 10/1959 | Schutzner | 324/55 |
| 3,823,369 | 7/1974 | Sinha | 324/51 |
| 3,846,698 | 11/1974 | Lawton | 324/51 |
| 4,249,170 | 2/1981 | Cham et al. | 340/646 |
| 4,654,806 | 3/1987 | Poyser et al. | 364/551 |
| 4,733,974 | 3/1988 | Hagerman | 374/103 |
| 4,857,827 | 8/1989 | Zoltan | 324/55 |
| 4,857,856 | 8/1989 | Coleman et al. | 324/547 |

FOREIGN PATENT DOCUMENTS
1178938 10/1964 Germany ..................... 29/11

Primary Examiner—Kenneth A. Wieder
Assistant Examiner—Barry C. Bowser
Attorney, Agent, or Firm—Ridout & Maybee

[57] ABSTRACT

A transformer fault analyzer provides on site fault analysis of electrical distribution transformers, relying on patterns of parameter variation in transformer winding ratios, winding resistance and magnetizing impedance, and comparison of these parameters to predetermined values. In a preferred embodiment the analysis considers transformer ratio balance and magnetizing impedance balance. The transformer analyzer may be used with the transformer under load or no load conditions, and thus can be used to test transformers in the field as well as surplus or refurbished transformers.

3 Claims, 29 Drawing Sheets

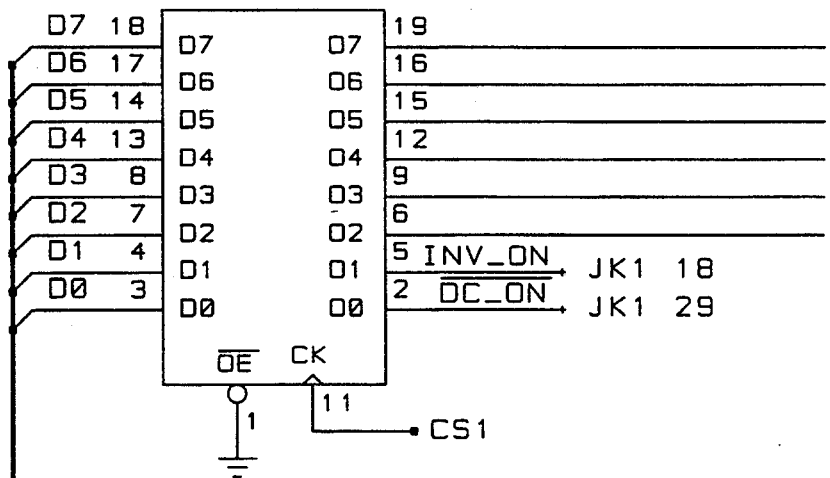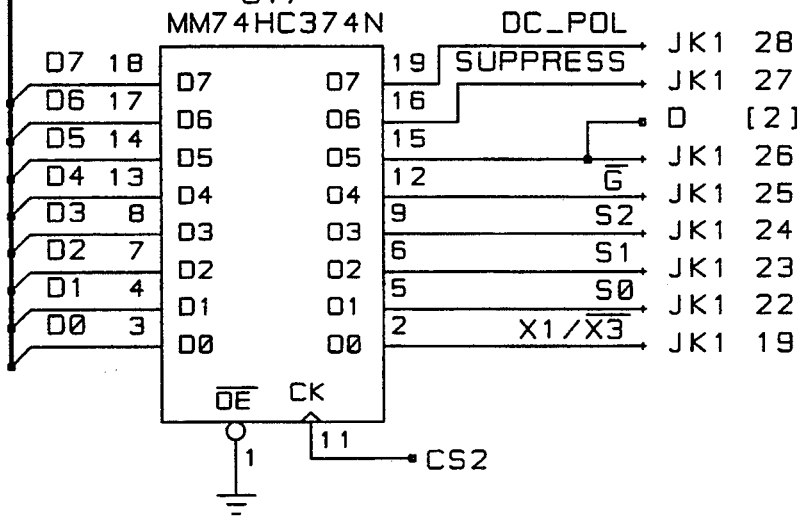
FIG. 3H

TRANSFORMER FAULT ANALYZER

FIELD OF THE INVENTION

This invention relates to transformer fault analyzers. In particular, this invention relates to a portable fault analyzer for in-situ testing of electrical distribution transformers in a high voltage distribution network.

BACKGROUND OF THE INVENTION

Distribution transformers used in electrical power distribution systems are known to fail from time to time. The dielectric failure of distribution transformer insulation causes a fault current to flow in the affected winding sections. This results in the fusing and/or welding of winding conductors in the immediate vicinity of the fault, so that the winding becomes locally either open-circuited or short-circuited. The severity of either condition will vary greatly, depending on the extent of damage to the winding. Even where winding damage is minor, the cutout fuse usually interrupts the fault current and removes the transformer from the system.

When a distribution transformer is spontaneously removed from service by a blown transformer fuse and no apparent cause can be found by line service personnel, current practise is to attempt to re-energize the transformer by replacing the fuse. In general, less than 10% of such failures are due to a faulty transformer. However, in the small but significant number of cases where the failure is due to internal damage to the transformer, re-energization causes catastrophic failure which can cause serious injuries to service personnel. Apart from being unsafe, the current practise can be costly due to repeat service calls to a malfunctioning transformer that has not been identified as the problem, and removal of properly working transformers from service where the actual problem cannot be located.

It is thus advantageous to be able to test a distribution transformer in the field prior to re-energization. It is further advantageous to be able to carry out some extent of transformer analysis without disconnecting the secondary load, to minimize disruption of electrical service to users.

The present invention provides a method and apparatus for in-situ fault analysis of electrical distribution transformers, which provides a high degree of reliability in detecting winding faults. The analyzer of the present invention provides sufficient information that usually the particular fault condition can be identified, often with the user's load still connected to the secondary terminals.

Transformer analysis according to the present invention relies on patterns of parameter variation in transformer winding ratios, winding resistance and magnetizing impedance, and comparison of these parameters to predetermined values. A fault condition is indicated by any significant deviation from the predetermined range. In a preferred embodiment of the invention this ratio analysis includes an analysis of transformer ratio balance and magnetizing impedance balance. The latter parameters significantly increase the likelihood of identifying certain types of fault conditions.

The transformer analyzer may also be used in the no load configuration to test surplus or refurbished transformers, and remove faulty units prior to disposal. In the former case, marginally faulty units will be prevented from being reintroduced into service; in the latter case, intact transformers or those with repairable fault types may be identified and salvaged.

SUMMARY OF THE INVENTION

The present invention thus provides a method of analyzing a transformer utilizing an analyzing apparatus comprising DC and AC power supplies, a voltmeter and an ammeter all selectively connected to test leads, comprising attaching the test leads to the terminals of a transformer winding, calculating a ratio of the number of turns in the primary winding to the number of turns in the secondary winding, calculating a ratio of the number of turns in the secondary winding to the number of turns in the primary winding, and comparing the first ratio with the second ratio to determine whether a fault condition exists.

The present invention further provides a method of analyzing a transformer utilizing an analyzing apparatus comprising DC and AC power supplies, a voltmeter and an ammeter all selectively connected to test leads, comprising attaching the test leads to the terminals of a transformer winding, calculating the magnetizing impedance of the transformer in a forward direction, calculating the magnetizing impedance of the transformer in a reverse direction, and comparing the forward magnetizing impedance to the reverse magnetizing impedance to determine whether a fault condition exists.

The present invention further provides a method of analyzing a transformer utilizing an analyzing apparatus comprising DC and AC power supplies, a voltmeter and an ammeter all selectively connected to test leads, comprising attaching the test leads to the terminals of a transformer winding, calculating the resistance of each of the primary and secondary windings, calculating the magnetizing impedance of the transformer, calculating the ratio of the number of turns in the primary winding to the number of turns in the secondary winding, comparing the calculated values with pre-ascertained values to determine if a fault condition exists.

BRIEF DESCRIPTION OF THE DRAWINGS

In drawings which illustrate by way of example only a preferred embodiment of the invention.

FIG. 4 is a block diagram illustrating the operating sequence of the transformer fault analyzer;

FIG. 5 is a circuit diagram showing an equivalent circuit of a faulted transformer;

FIG. 6 is a table showing ranges of acceptable winding resistance limits in transformers of various voltage and kVA ratings;

FIG. 7 is a table showing ranges of X/R ratios of transformer leakage impedance;

FIG. 8 is a table showing relay contact positions for determining DC resistance parameters; and FIG. 9 is a table showing relay contact positions for determining AC impedance and ratio parameters.

DETAILED DESCRIPTION OF THE INVENTION

Figure 1A:
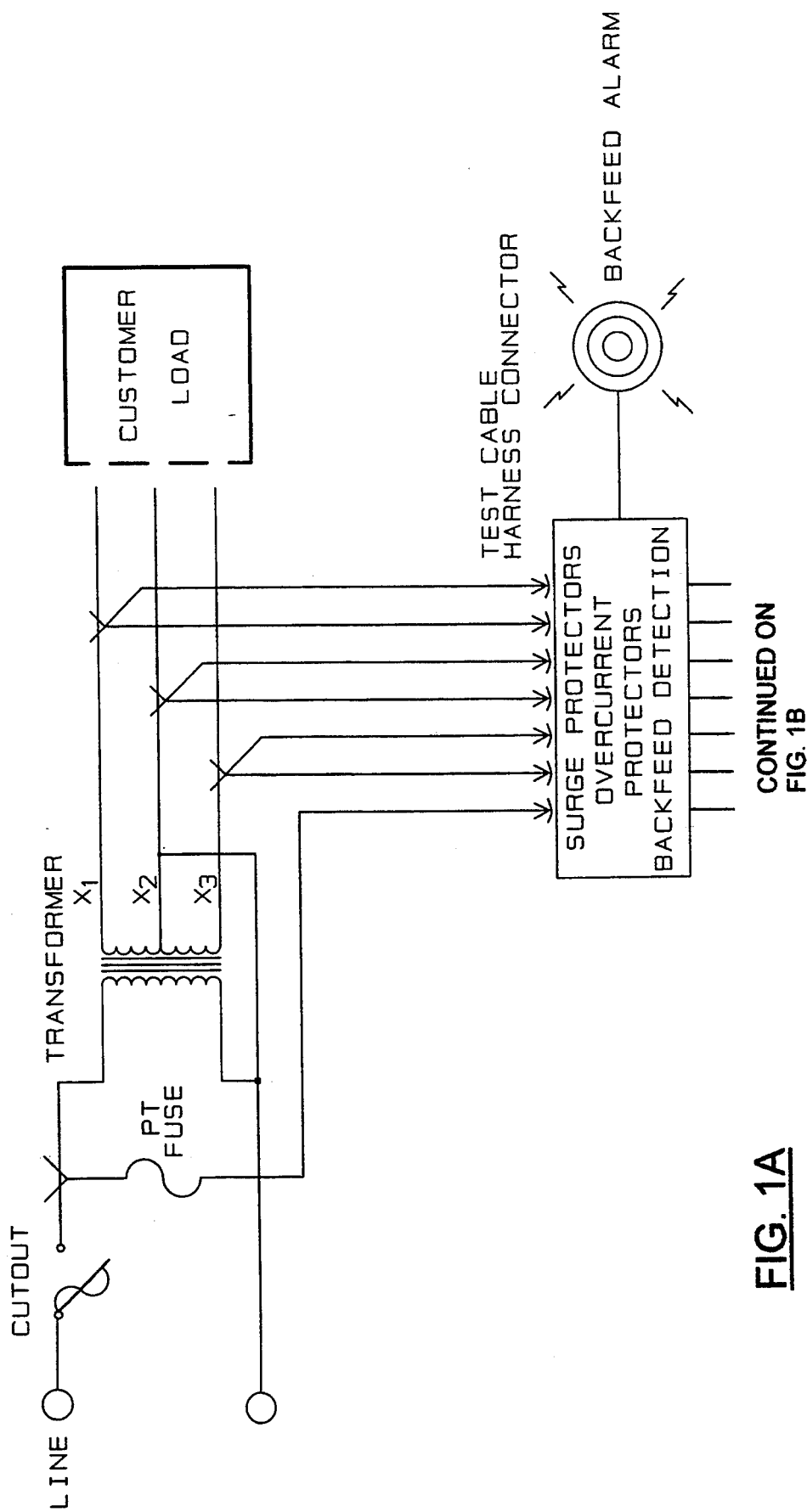
FIG. 1 is a block diagram showing the components of the transformer fault analyzer of the present invention.

In general, the following transformer fault symptoms can be attributed to the failure modes listed thereafter:

1. Excessive primary current resulting in a blown fuse winding fault to core or tank
lead or accessory fault to core or tank
corruption of insulation between high voltage and low voltage windings
massive winding fault (several adjacent layers faulted)
layer to layer fault.

2. Anomalous secondary voltage output
layer to layer fault
turn to turn fault
layer bypass
turn bypass
winding discontinuity
open leads or internal connections
internal switching or O/C protective device malfunction.

The three dominant types of winding faults are an open winding, a turn or layer bypass and a winding short circuit. Any of these faults can occur in either the primary or secondary windings, but the majority will occur in the primary winding. Most such faults are due to corruption of the winding insulation, involving a flashover or dielectric puncture of the insulation, which establishes a fault path through an electric arc. This will generally cause melting of the conductors with resulting displacement of conductor material through globulation and vaporization, interrupting the continuity of the winding and causing an open winding condition which can be readily detected by resistance measurement.

Occasionally the gap will be bridged by carbon and metallic particles, noticeably increasing the resistance of the winding. Detectability will then depend upon the resistance of the bridged path. Moreover, in most cases the fault punctures the insulation between winding layers and welds together conductors in the adjacent layers, creating a short circuited winding or, if turns of the shorted layer burn open, a layer bypass. These conditions cannot be reliably detected by resistance measurements alone, since the resulting resistance differs by only a few percent from the nominal value, which has a substantial tolerance.

The present invention provides a method and apparatus for analyzing a faulty distribution transformer and ascertaining which failure mode is responsible for the fault. In a preferred embodiment, the analysis covers three parameters:

1. Winding Resistance: Every transformer winding consists of a finite length of metal conductor which therefore has a measurable DC resistance. Measurement is accomplished using a portable multimeter capable of measuring resistances of less than 1 k$\Omega$.

2. Magnetizing impedance: This consists of two components, the magnetizing reactance and the core losses. Magnetizing reactance represents the energy that is periodically stored and recovered with each half cycle of the applied 60 Hz voltage in orienting the magnetic domains of the transformer core. The core losses are represented by equivalent resistance model of the power losses due to the rotation of the magnetic domains and eddy current losses in the core. Magnetizing impedance is measured by energizing the transformer from one of the windings while the other is disconnected from all load.

The impedance is the ratio of the voltage and the current into the energized winding. The reactance and resistance values can be determined by measuring the angular displacement between the current and voltage traces. Because it is normally very high, magnetizing impedance is quite sensitive to even relatively minor defects in the transformer such as shorted turns. This measurement is taken from both windings, each while the other is disconnected from all load, to obtain a measure of the impedance balance.

3. Winding ratio: This is the ratio of turns on the primary and secondary windings. The effective ratio will be affected by the loading of the transformer and the presence of shorted turns. Thus, a transformer in good condition with no load connected to its secondary terminals should provide an effective winding ratio value which is very close to the nominal design value given by the turns ratio. This ratio is also measured from both windings, to obtain a measure of the winding ratio balance.

Figure 1B:
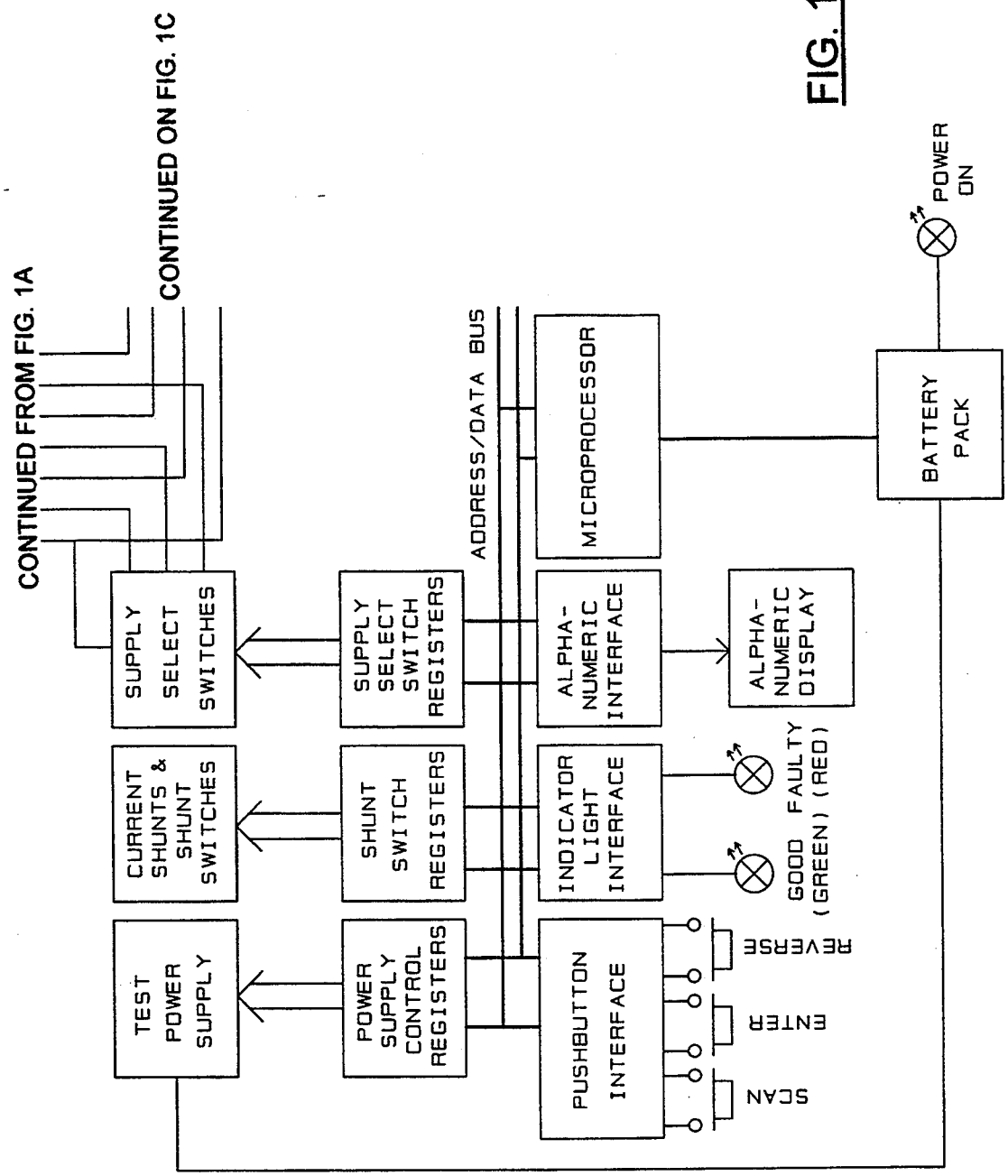
Figure 1C:
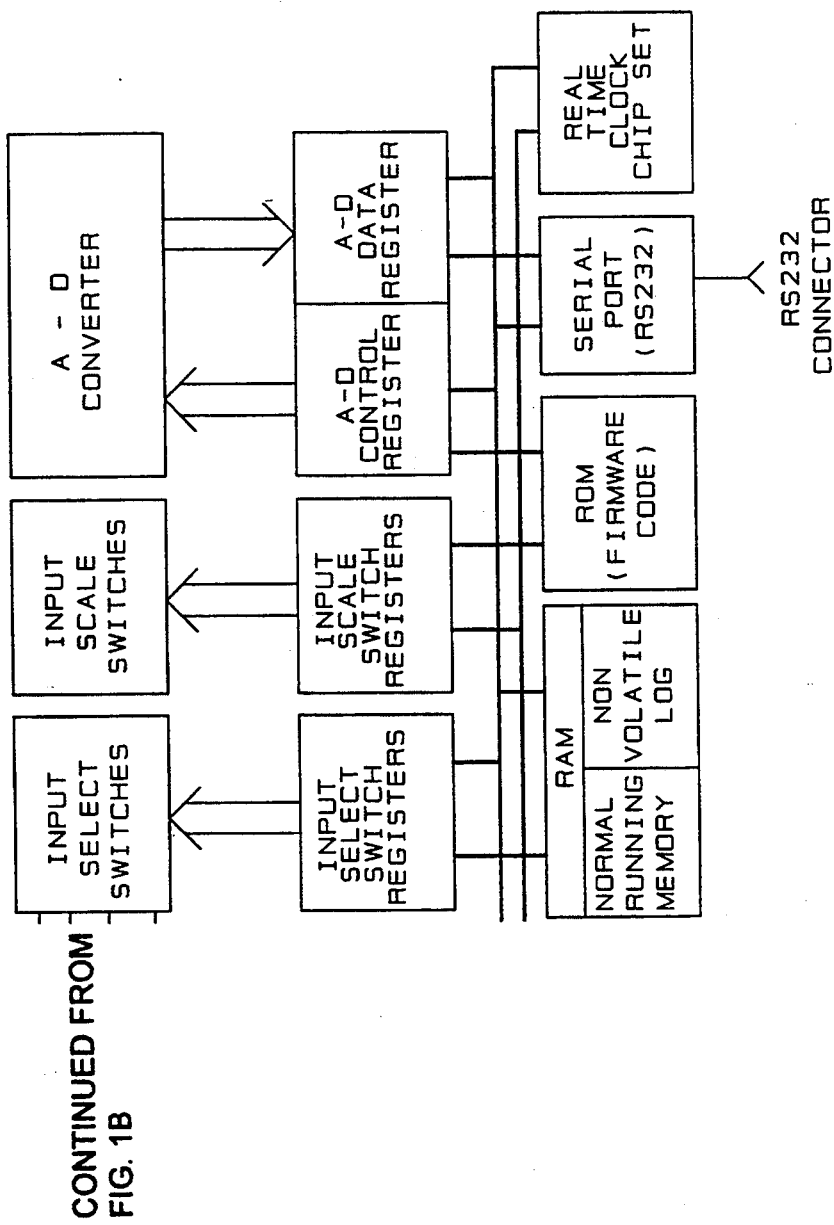
Figure 2A:
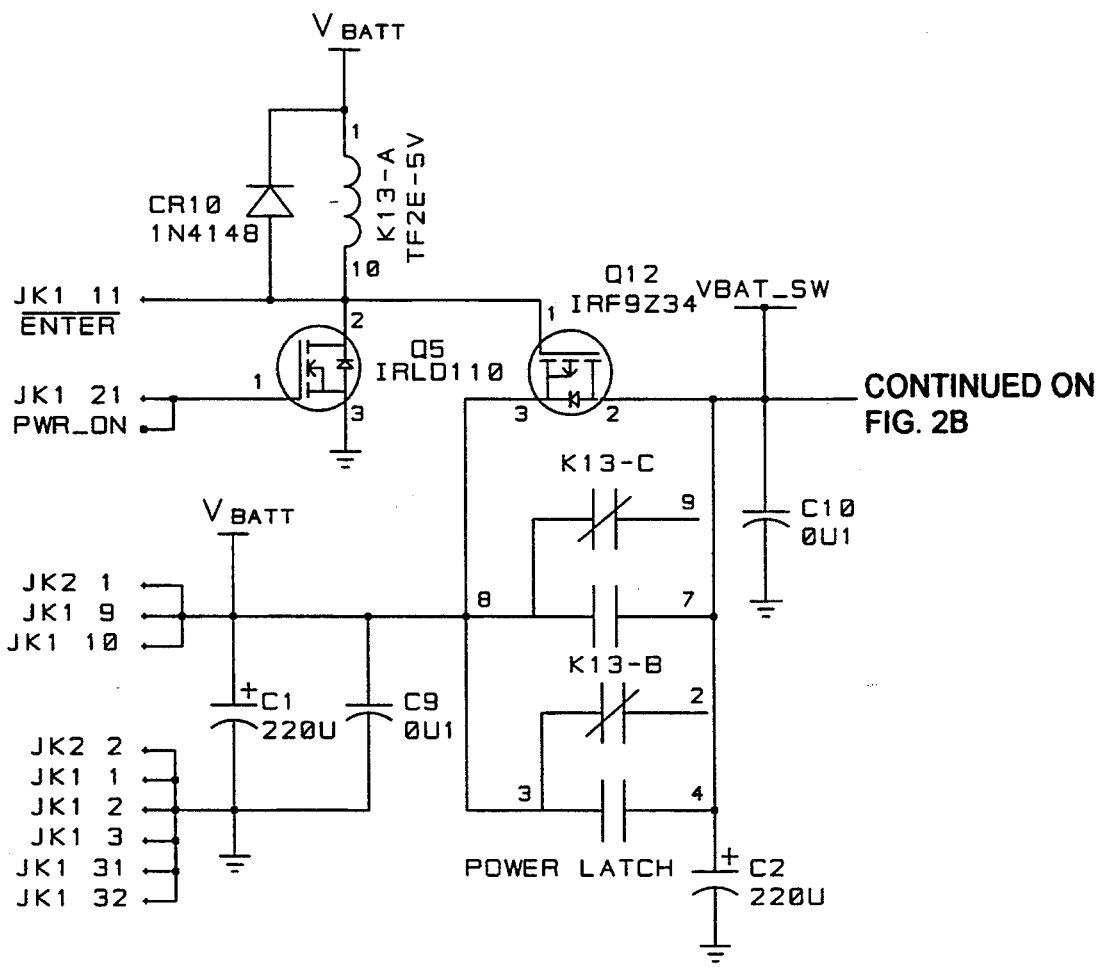
FIG. 2 is a schematic diagram of the analog circuitry of the transformer fault analyzer.
Figure 2B:
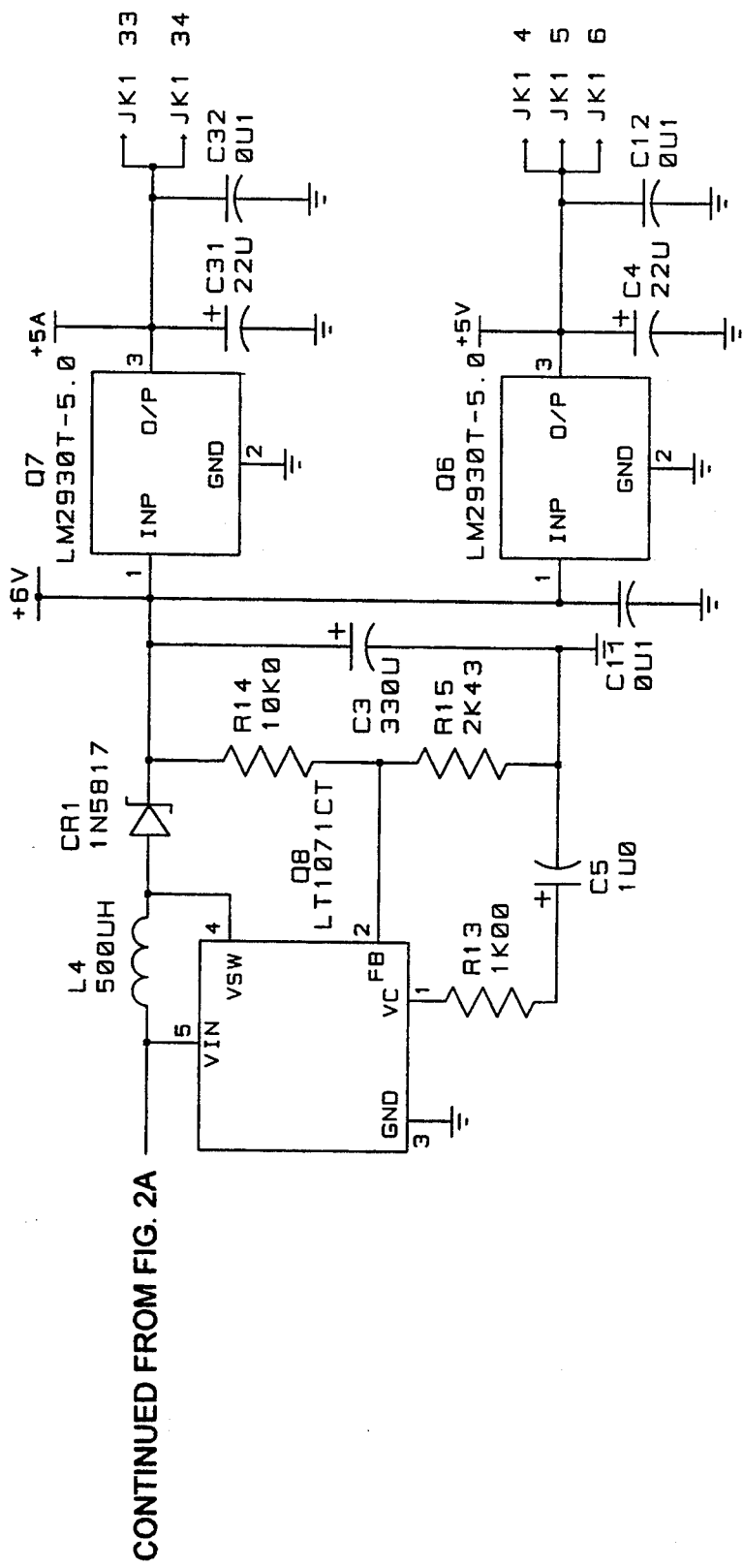
Figure 2C:
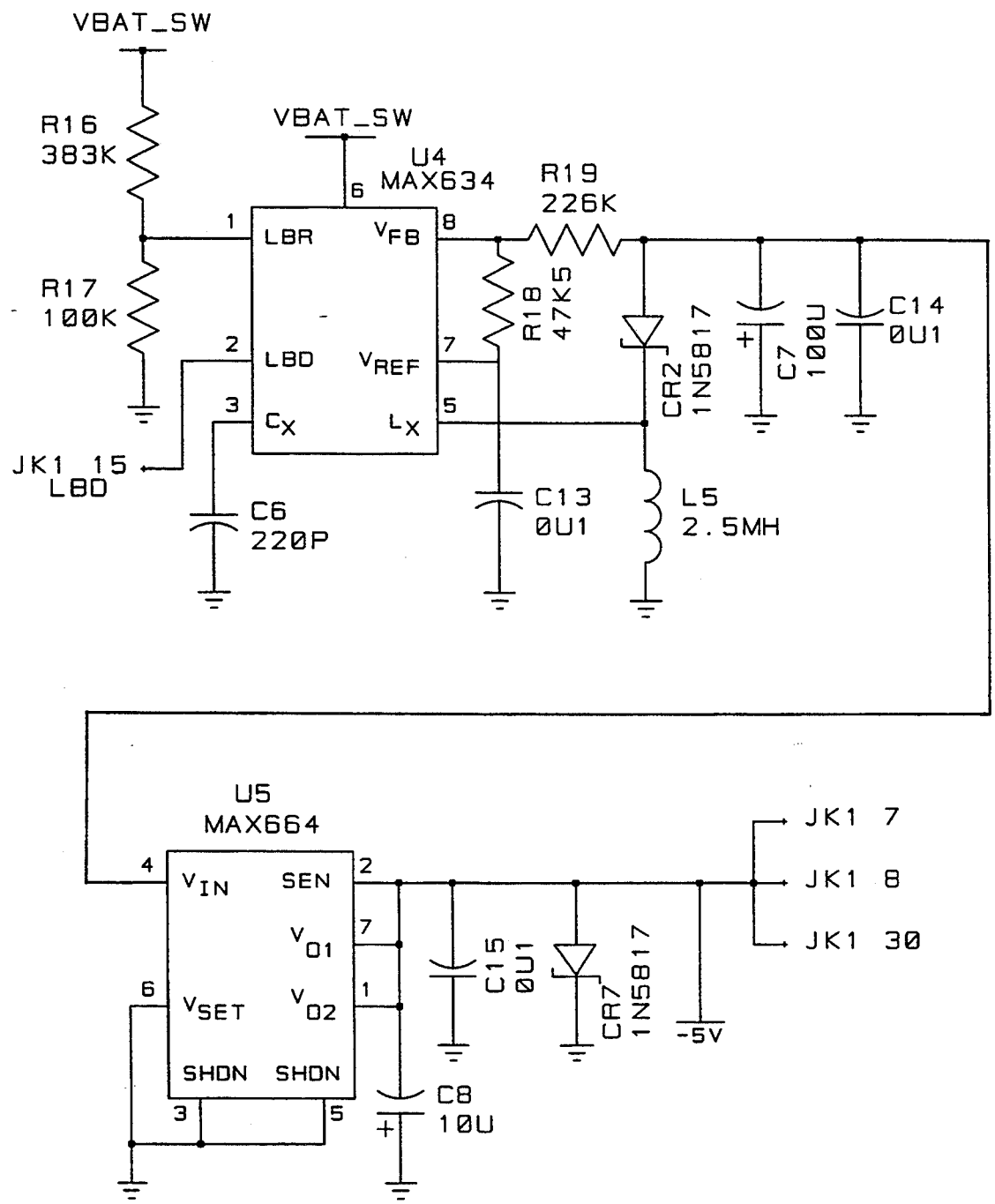
Figure 2D:
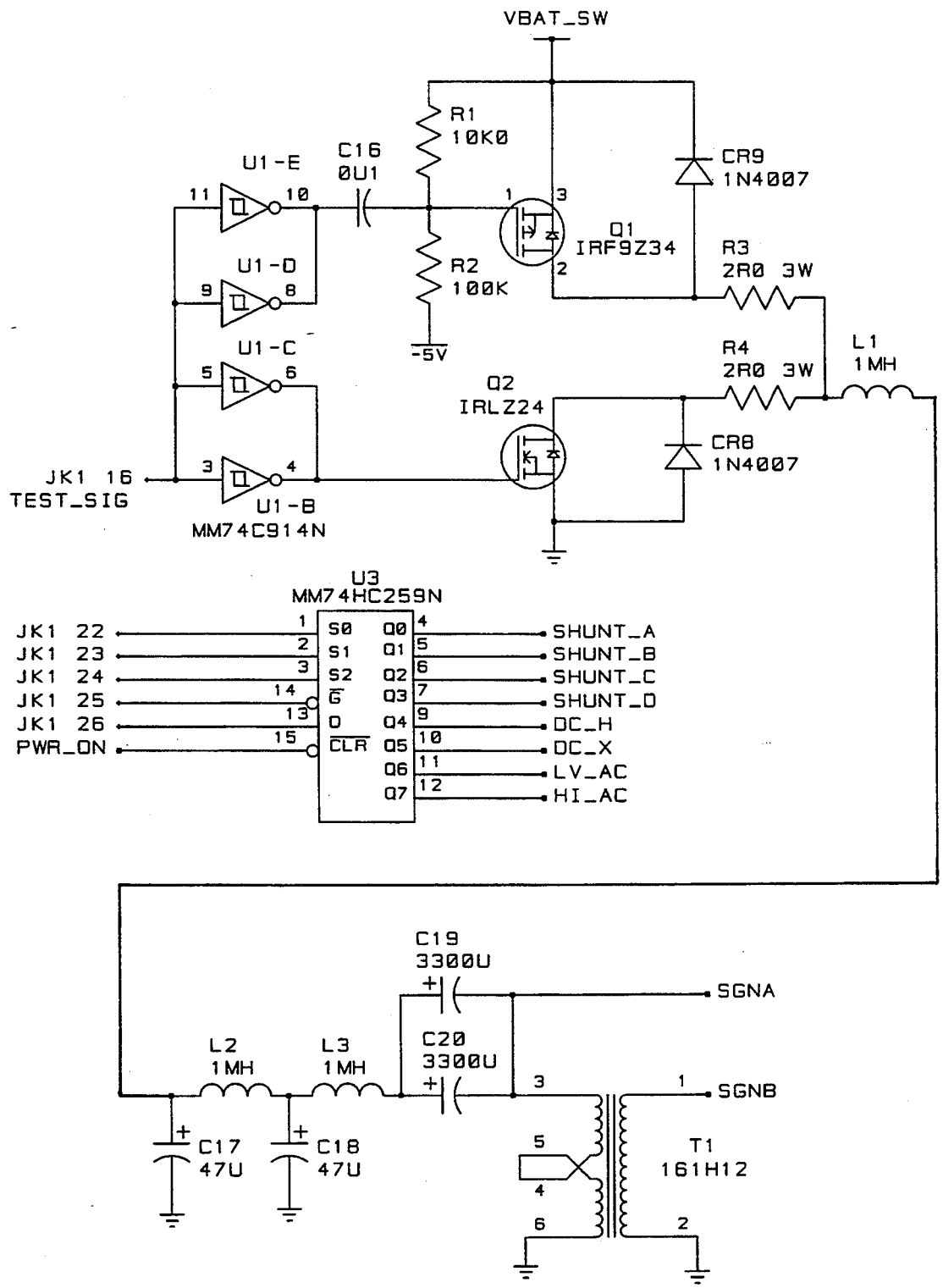
Figure 2E:
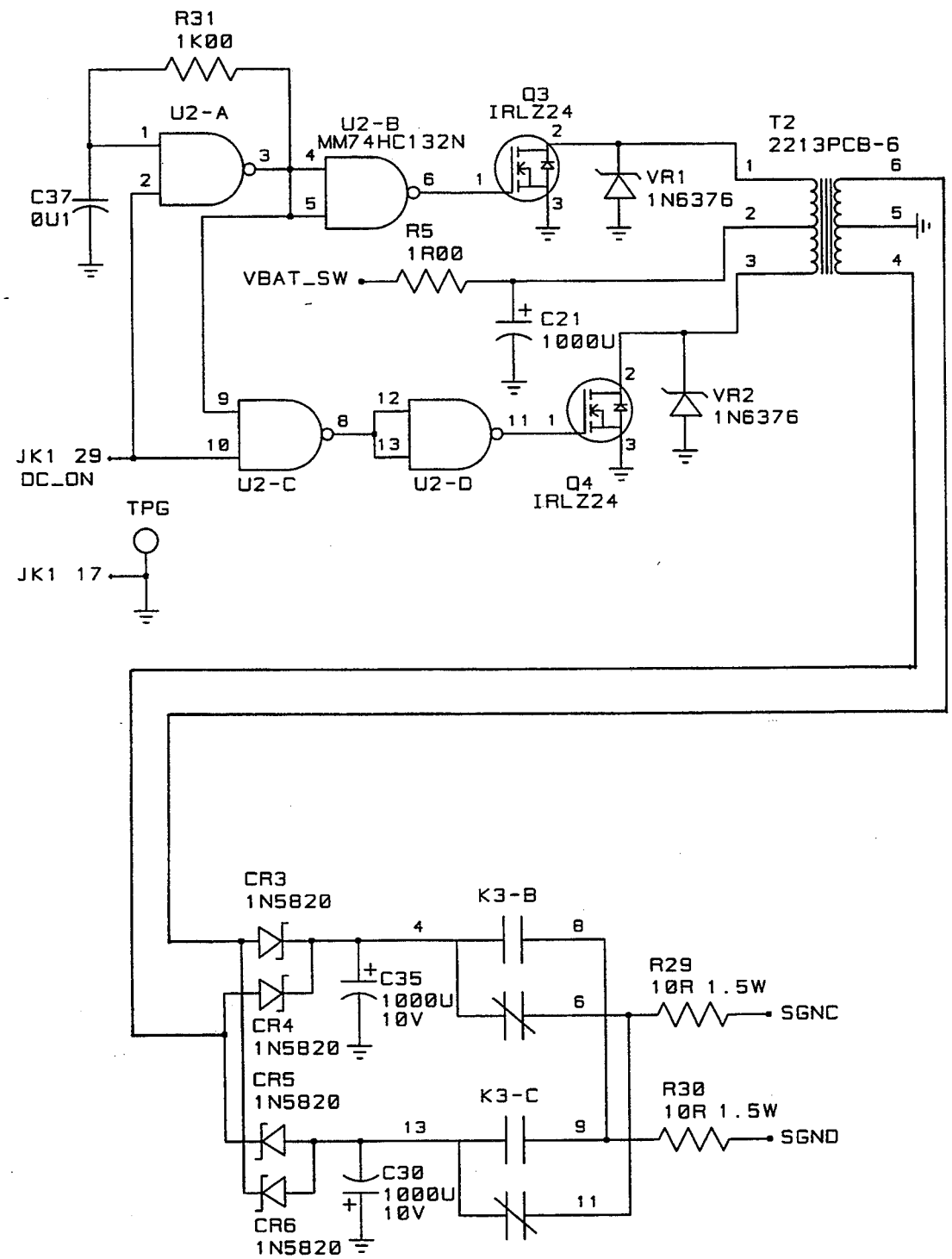
Figure 2F:
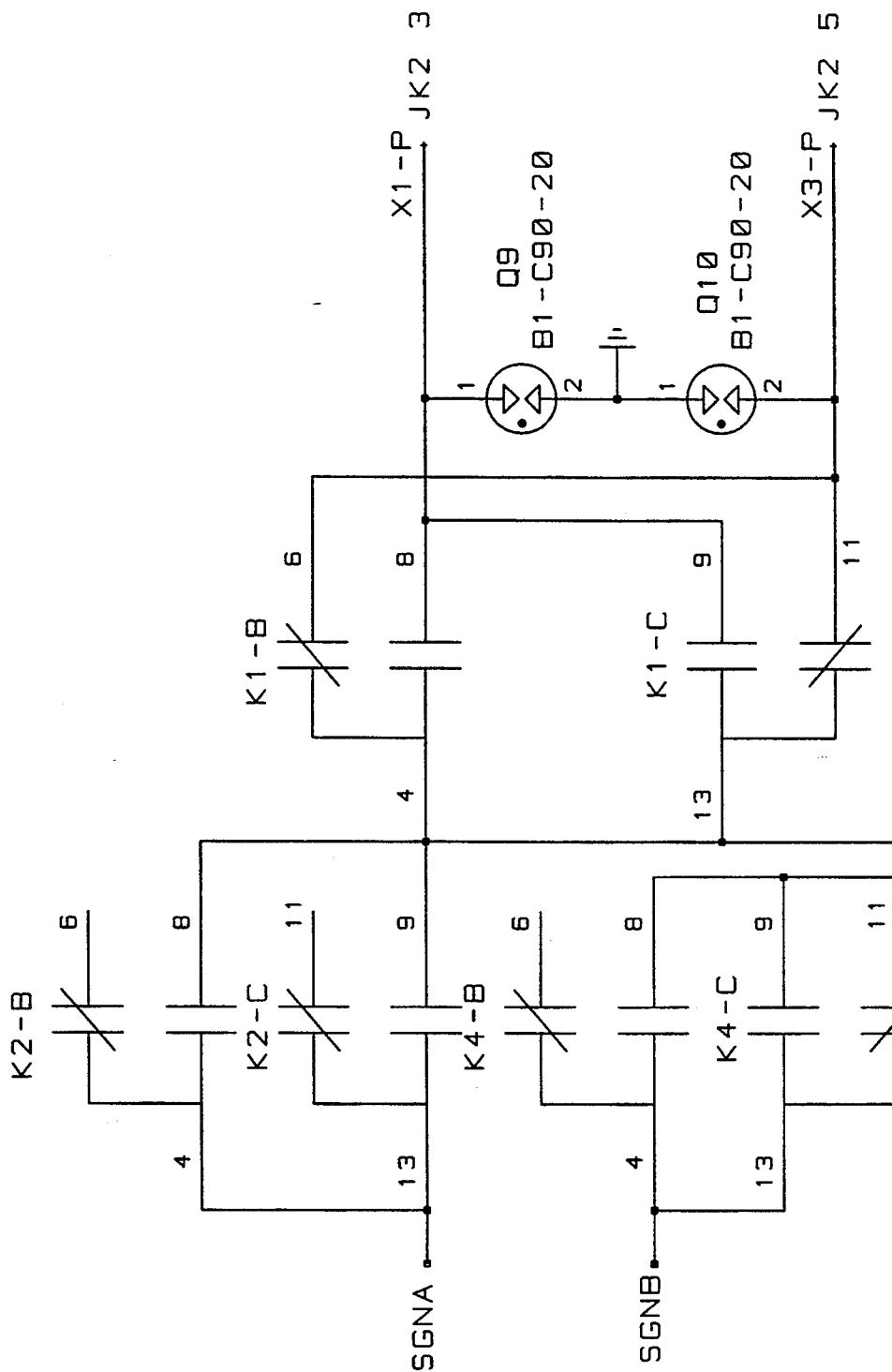
Figure 2G:
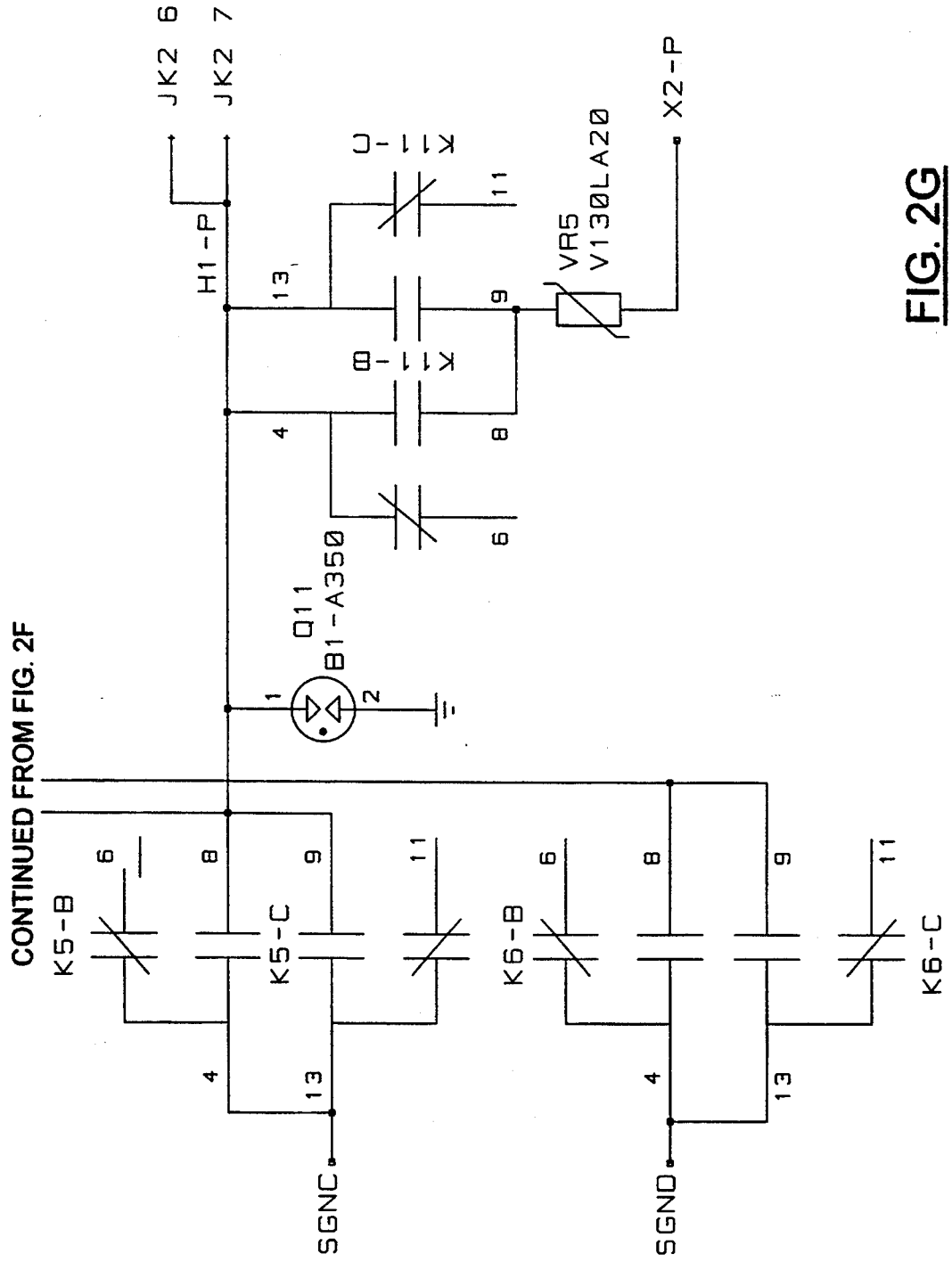
Figure 2H:
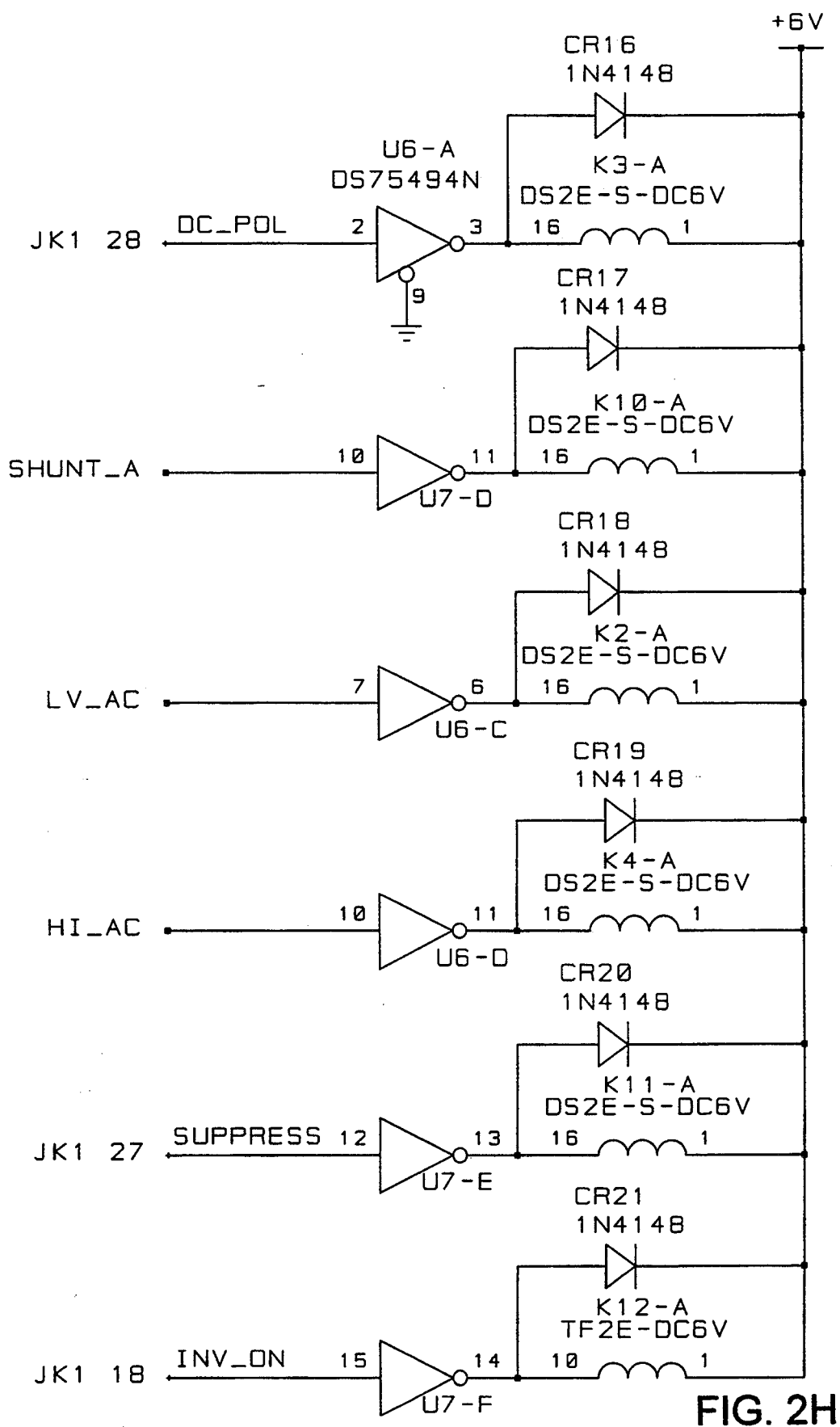
Figure 21:
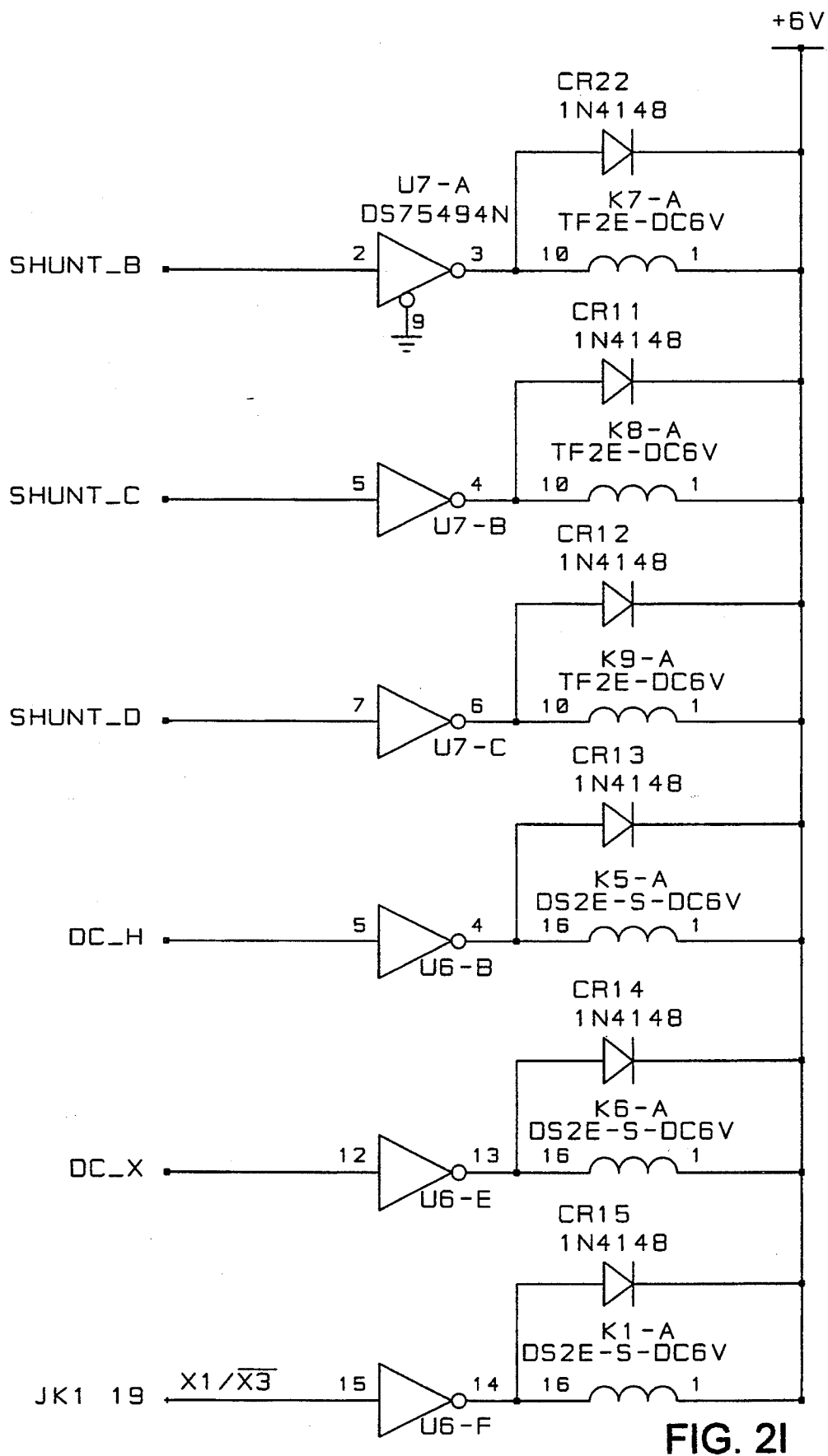
Figure 2J:
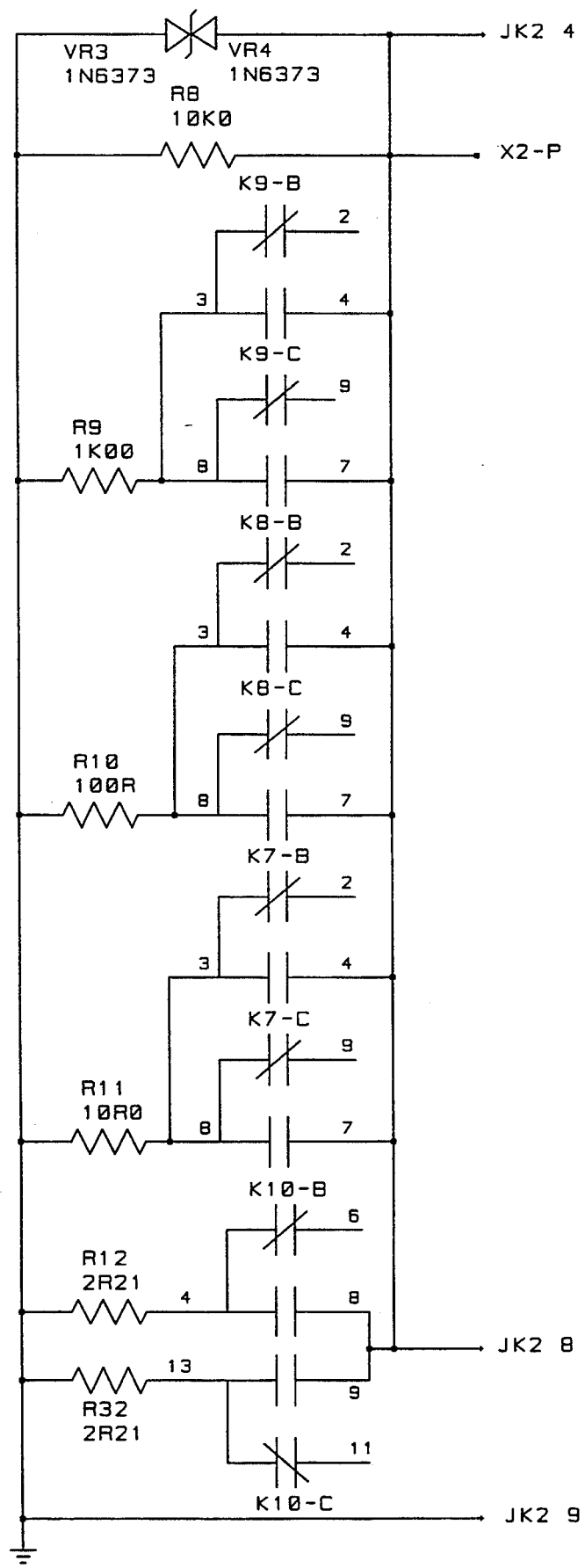
Figure 2K:
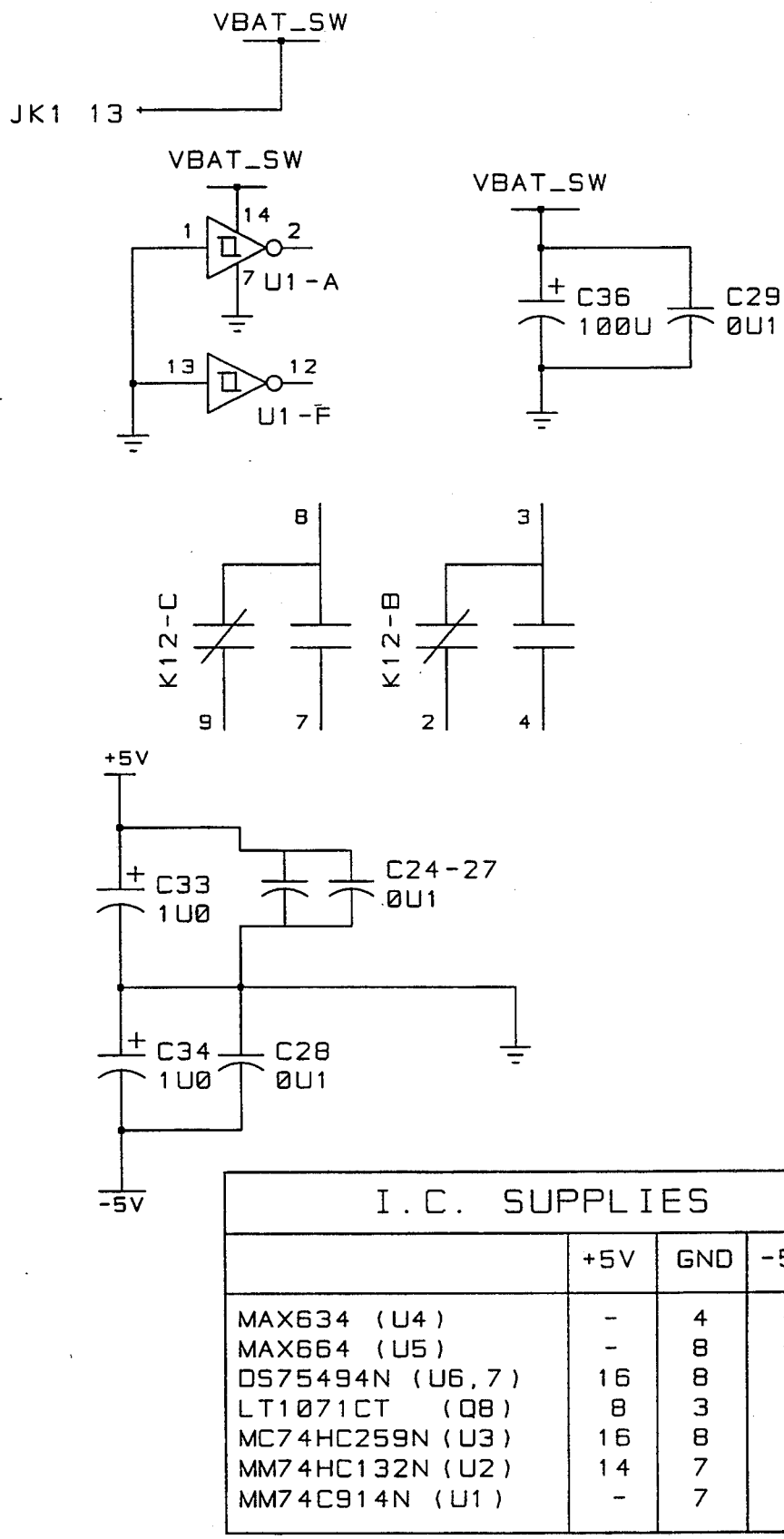
Figure 3A:
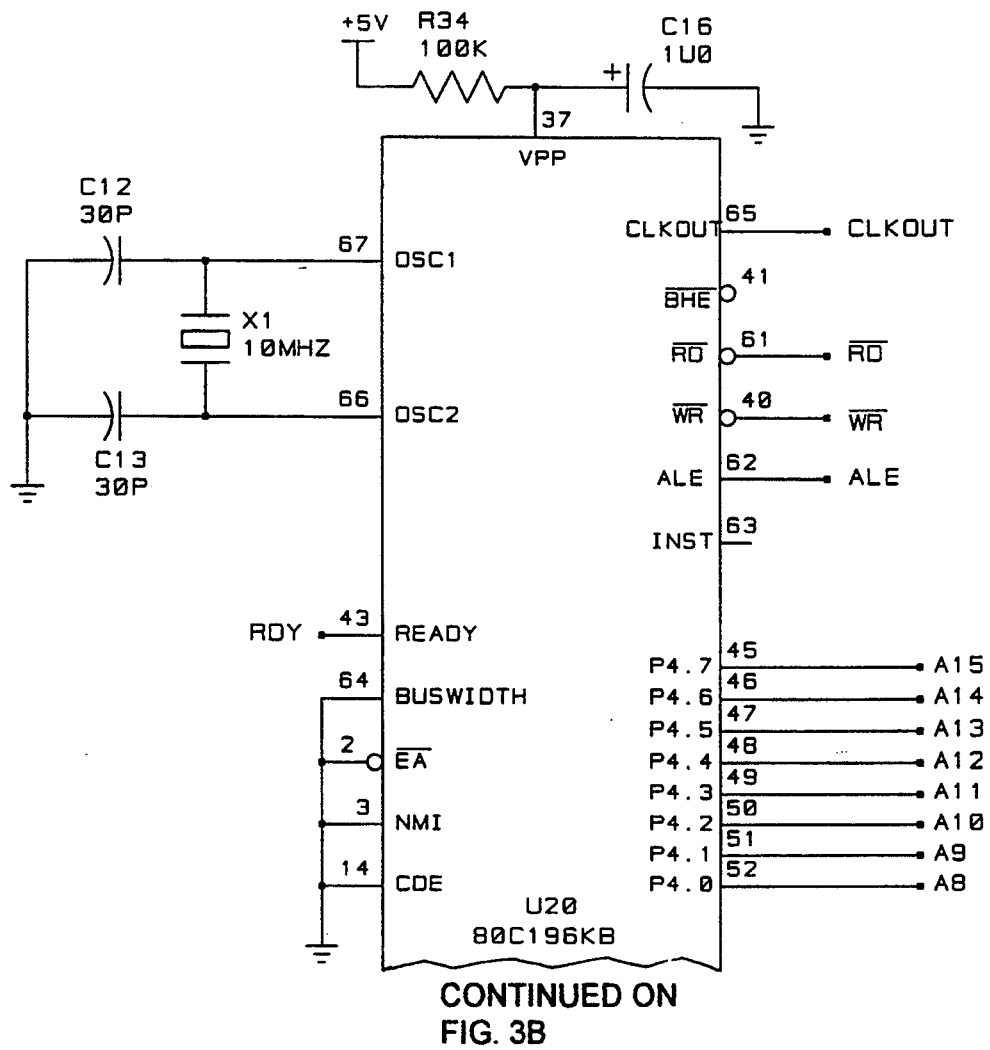
FIG. 3 is a schematic diagram of the digital circuitry of the transformer fault analyzer.
Figure 3B:
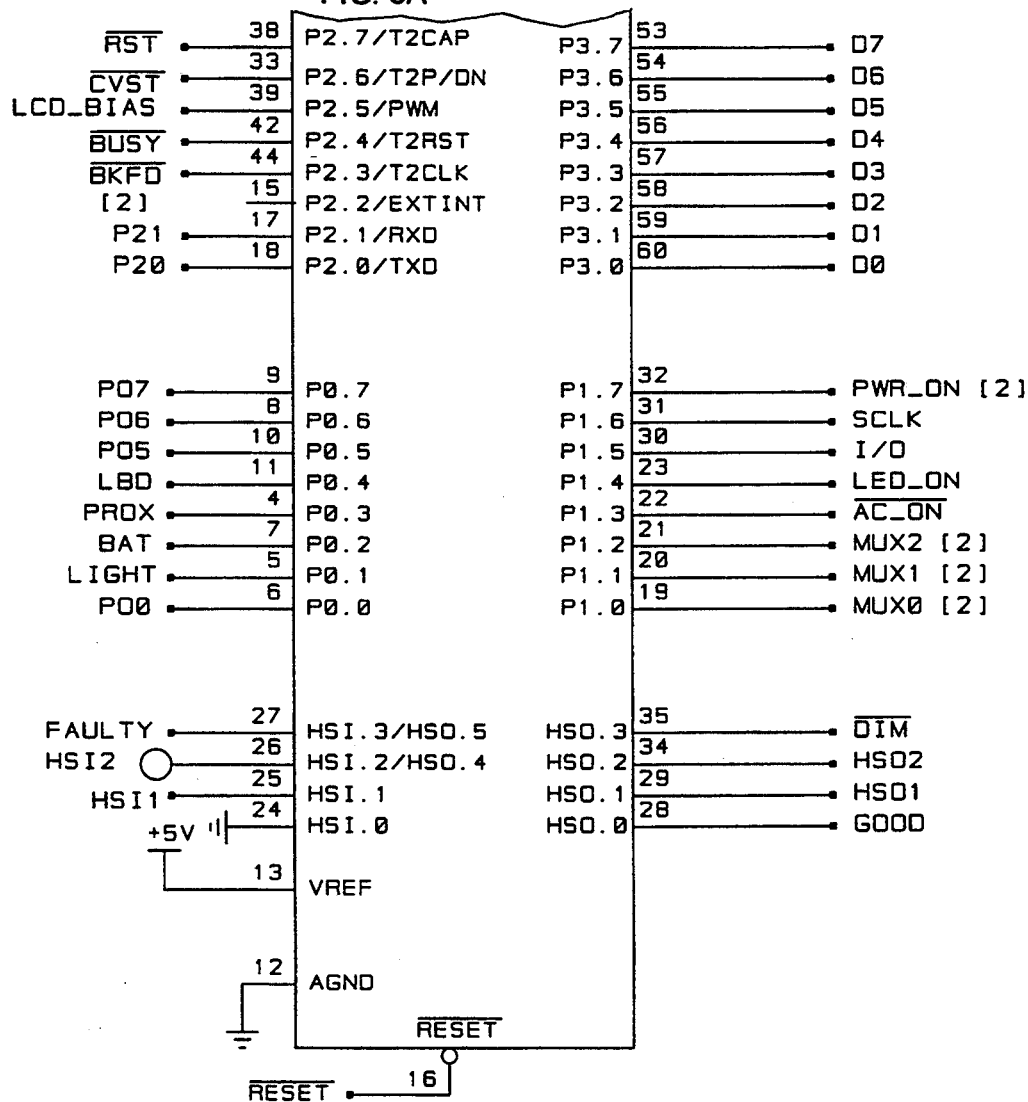
Figure 3C:
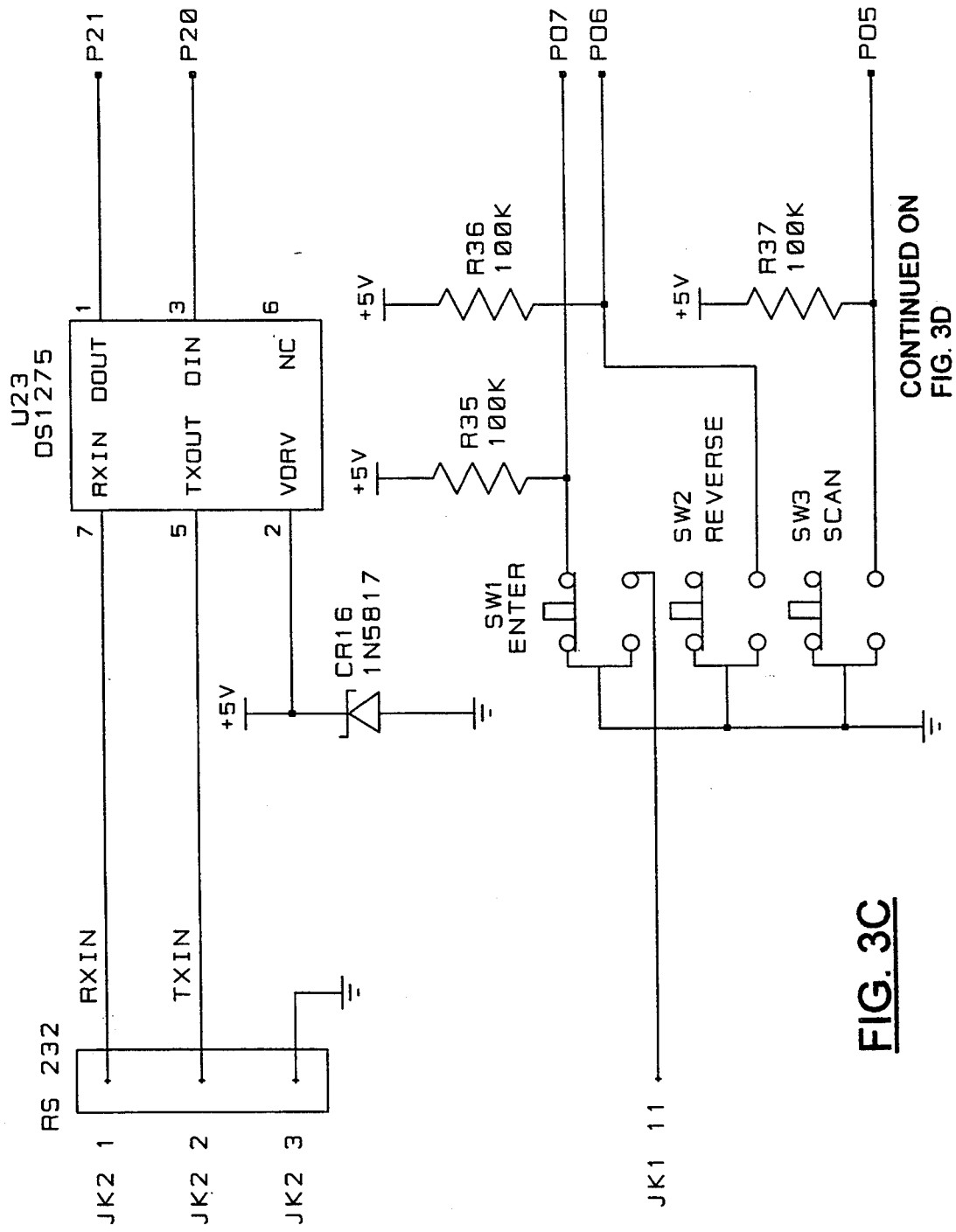
Figure 3D:
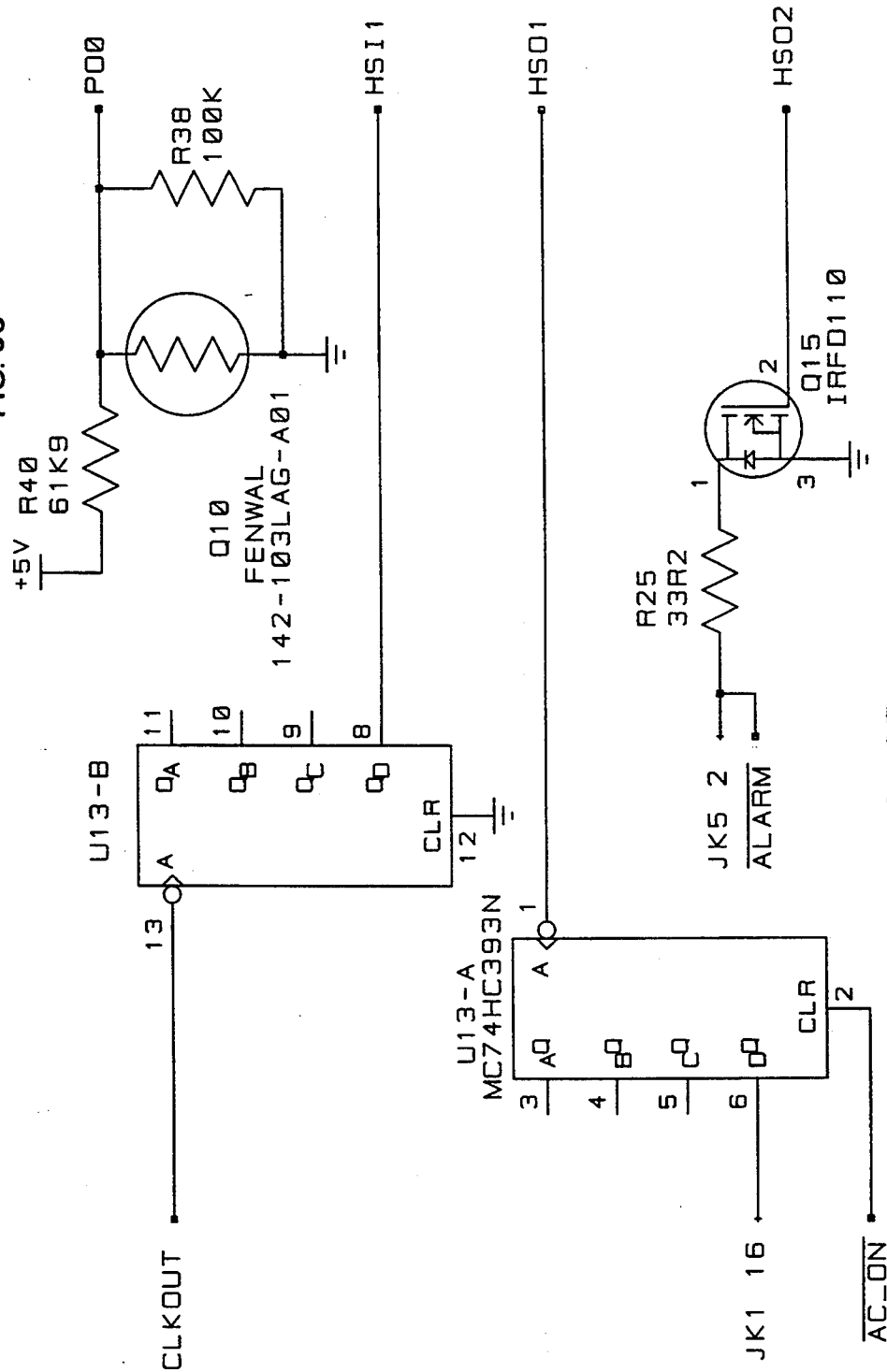
Figure 3E:
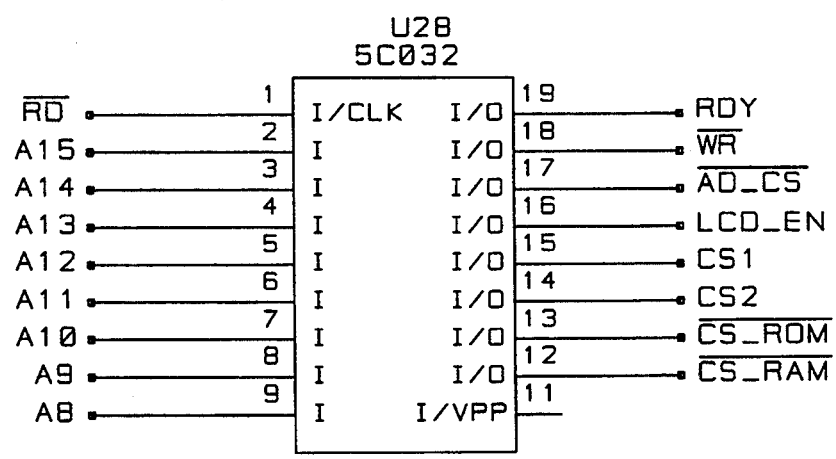
Figure 3F:
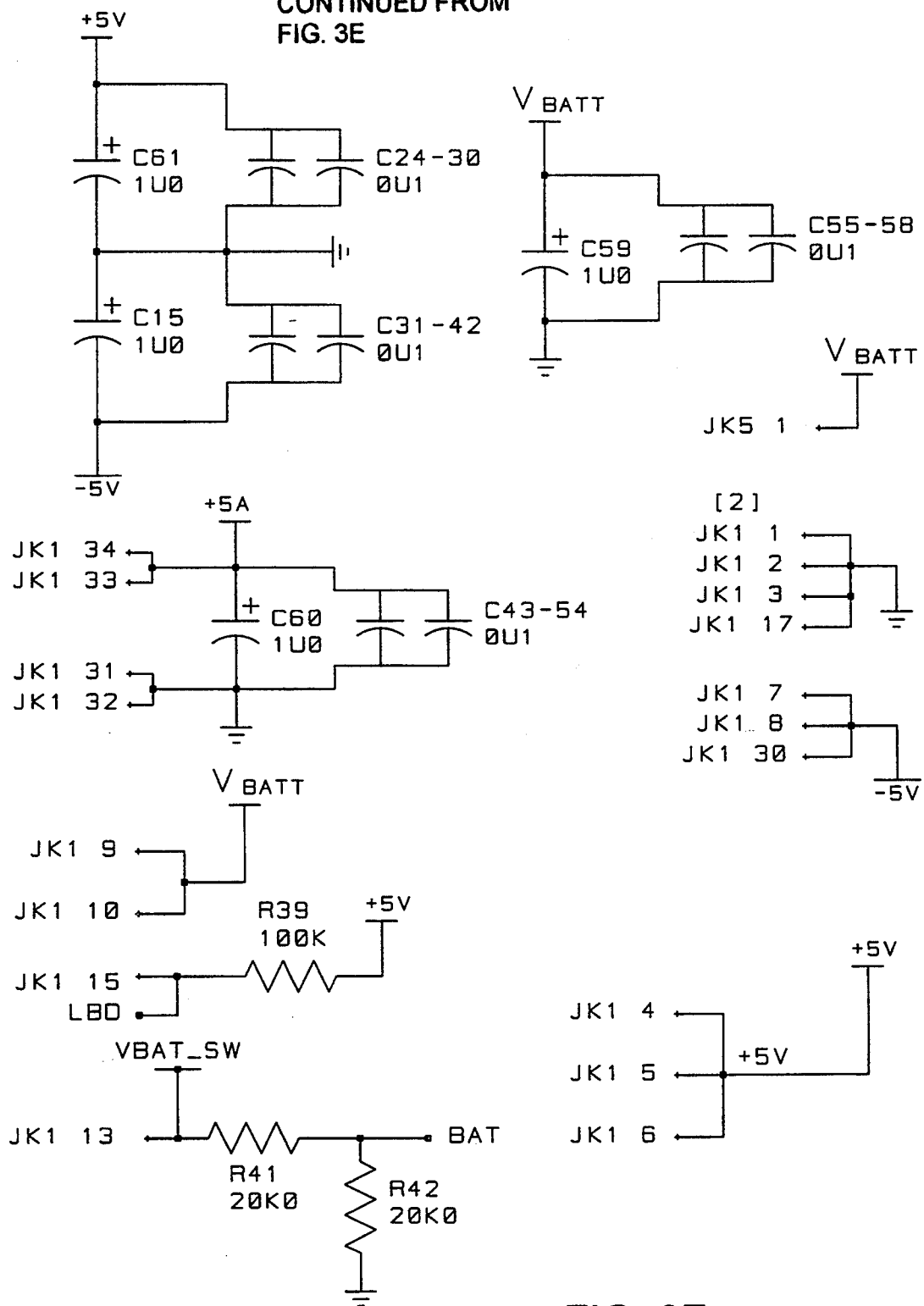
Figure 3G:
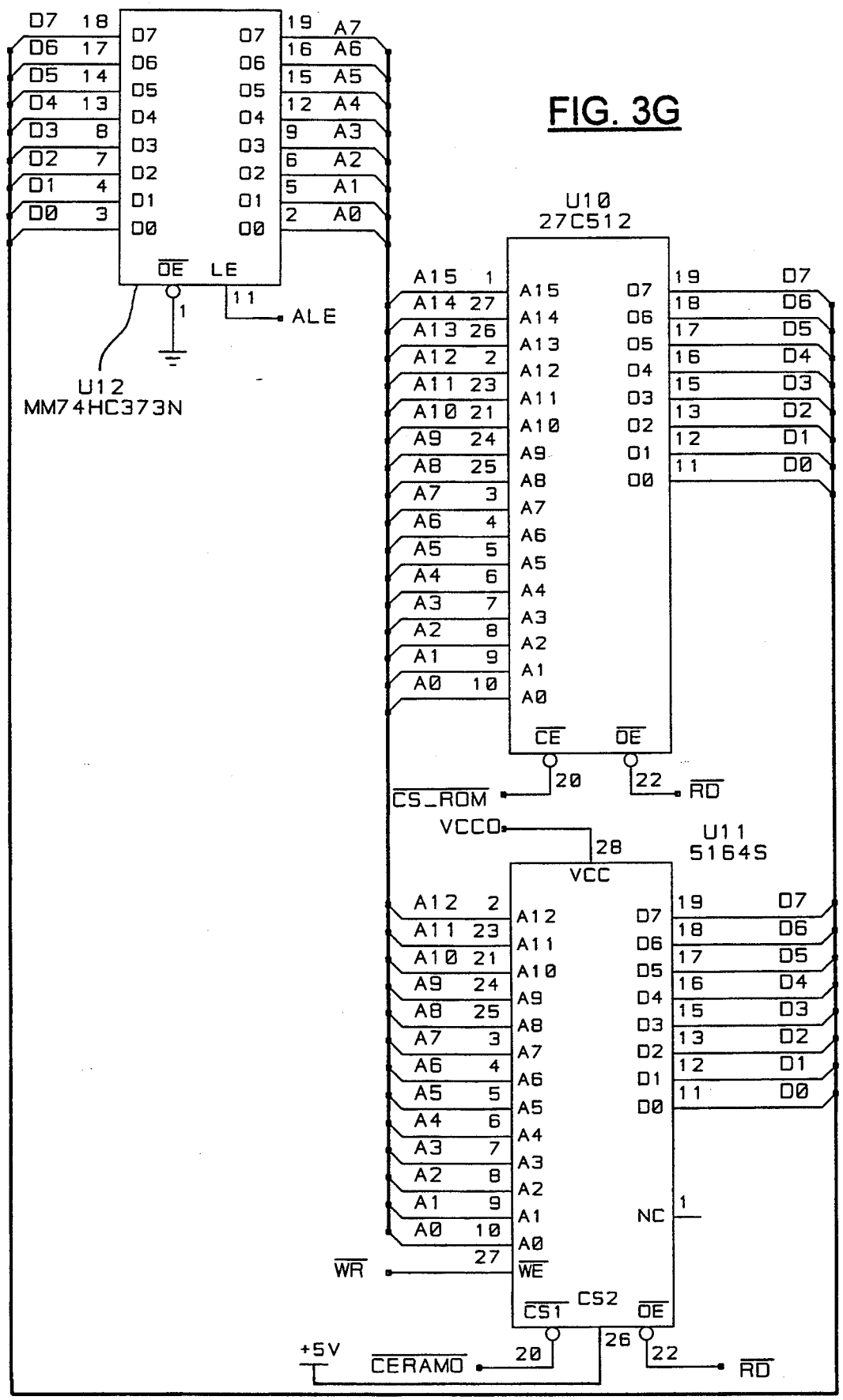
Figure 3I:
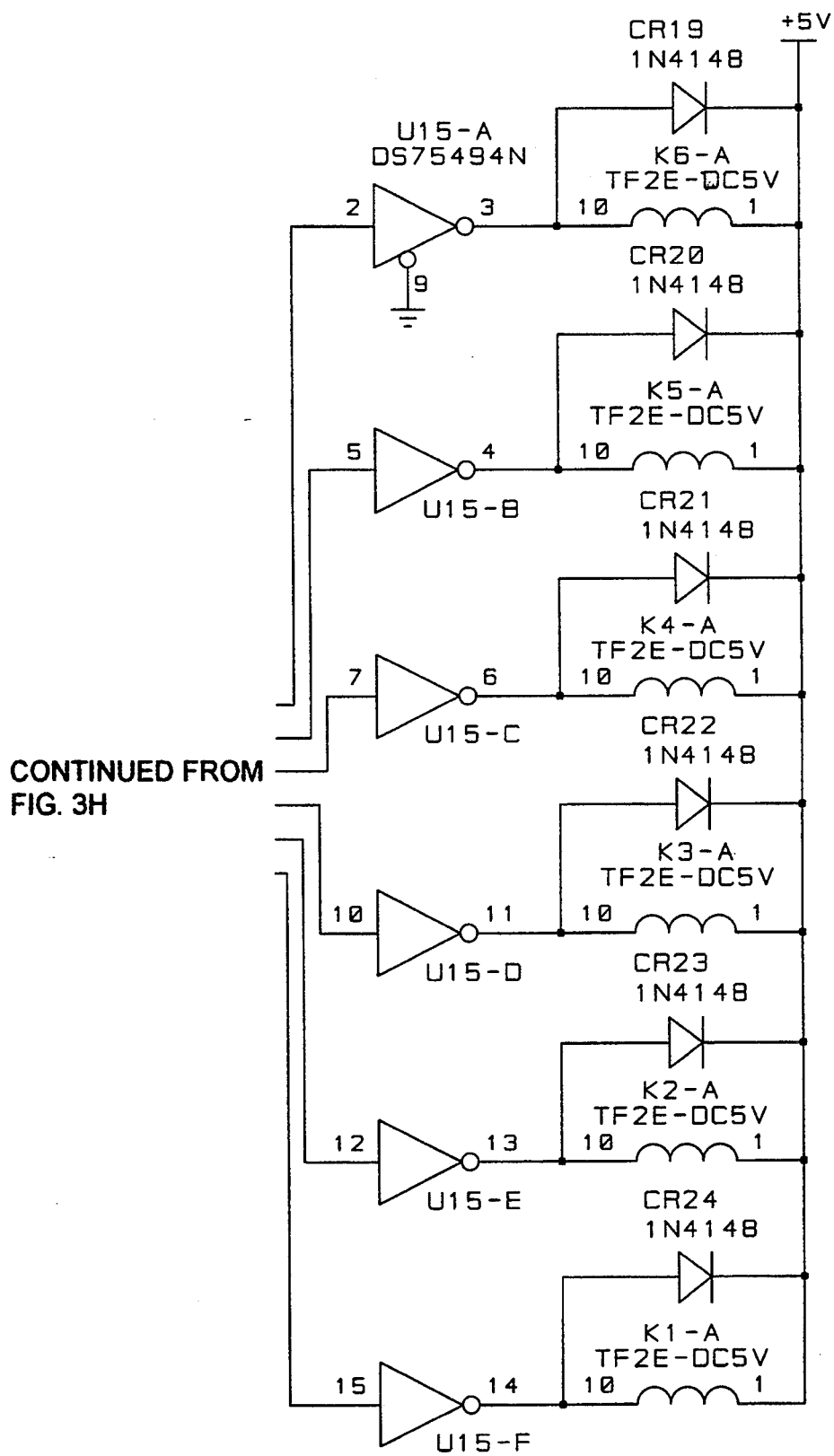
Figure 3J:
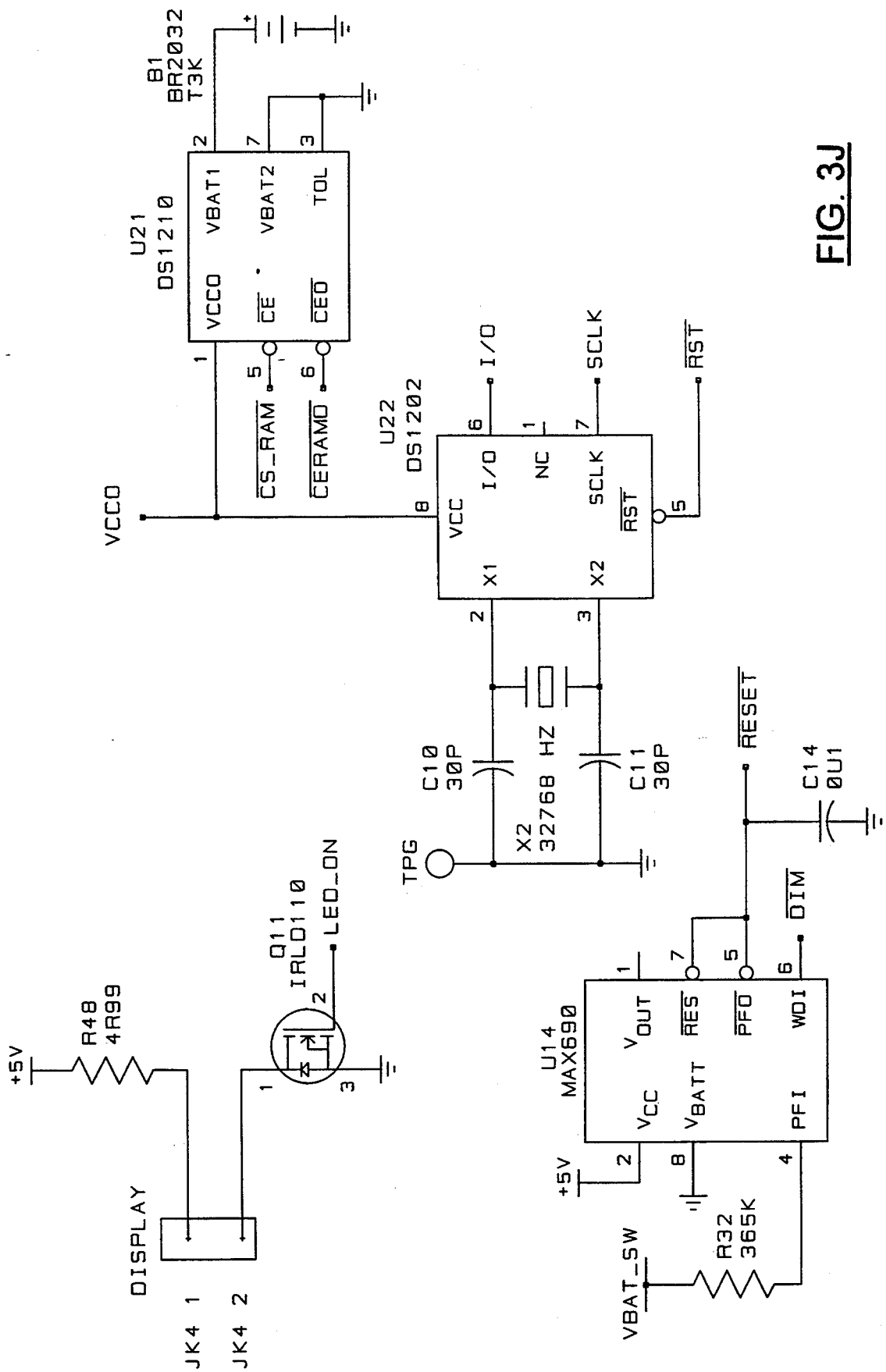
Figure 3K:
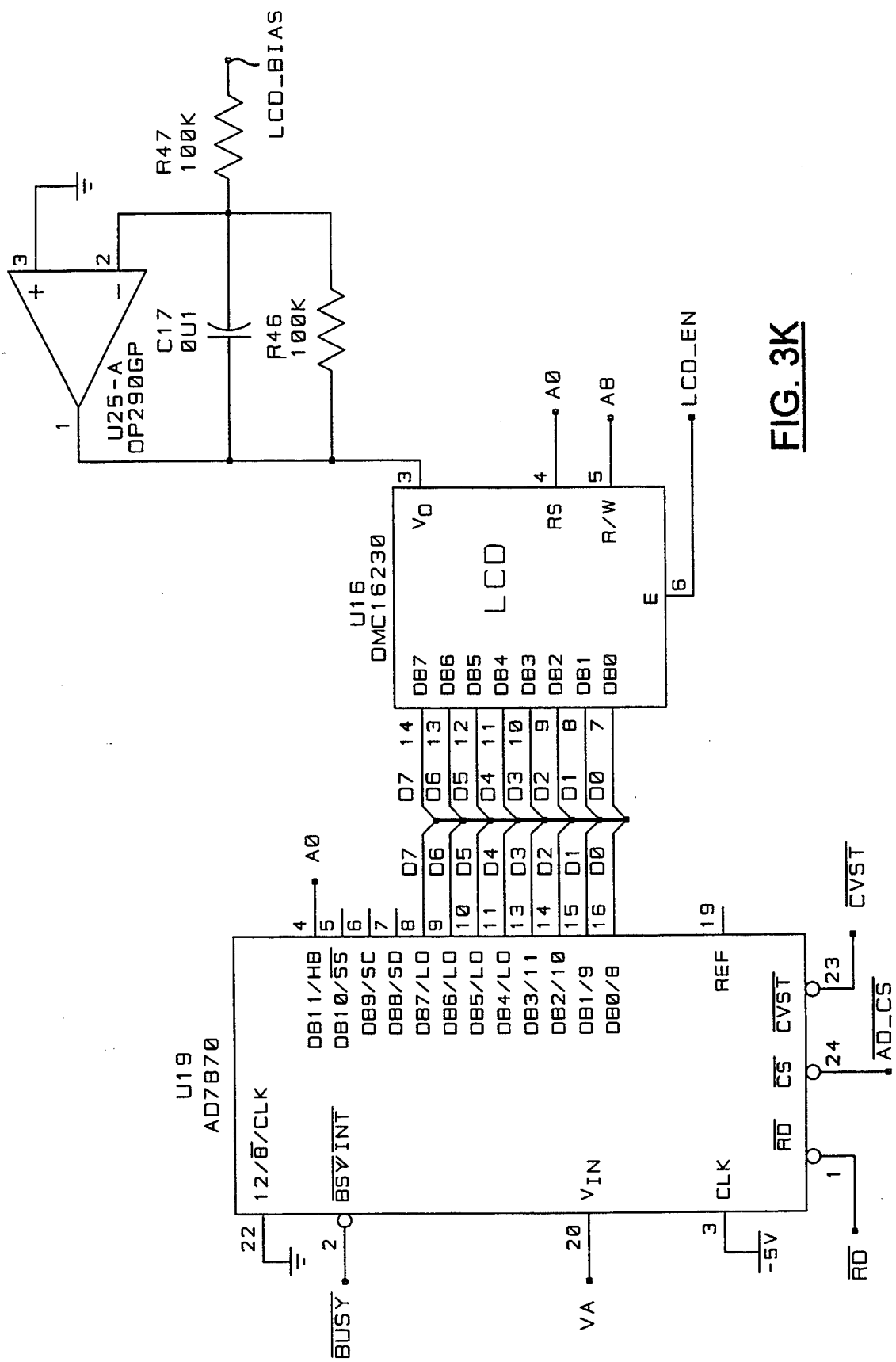
Figure 3L:
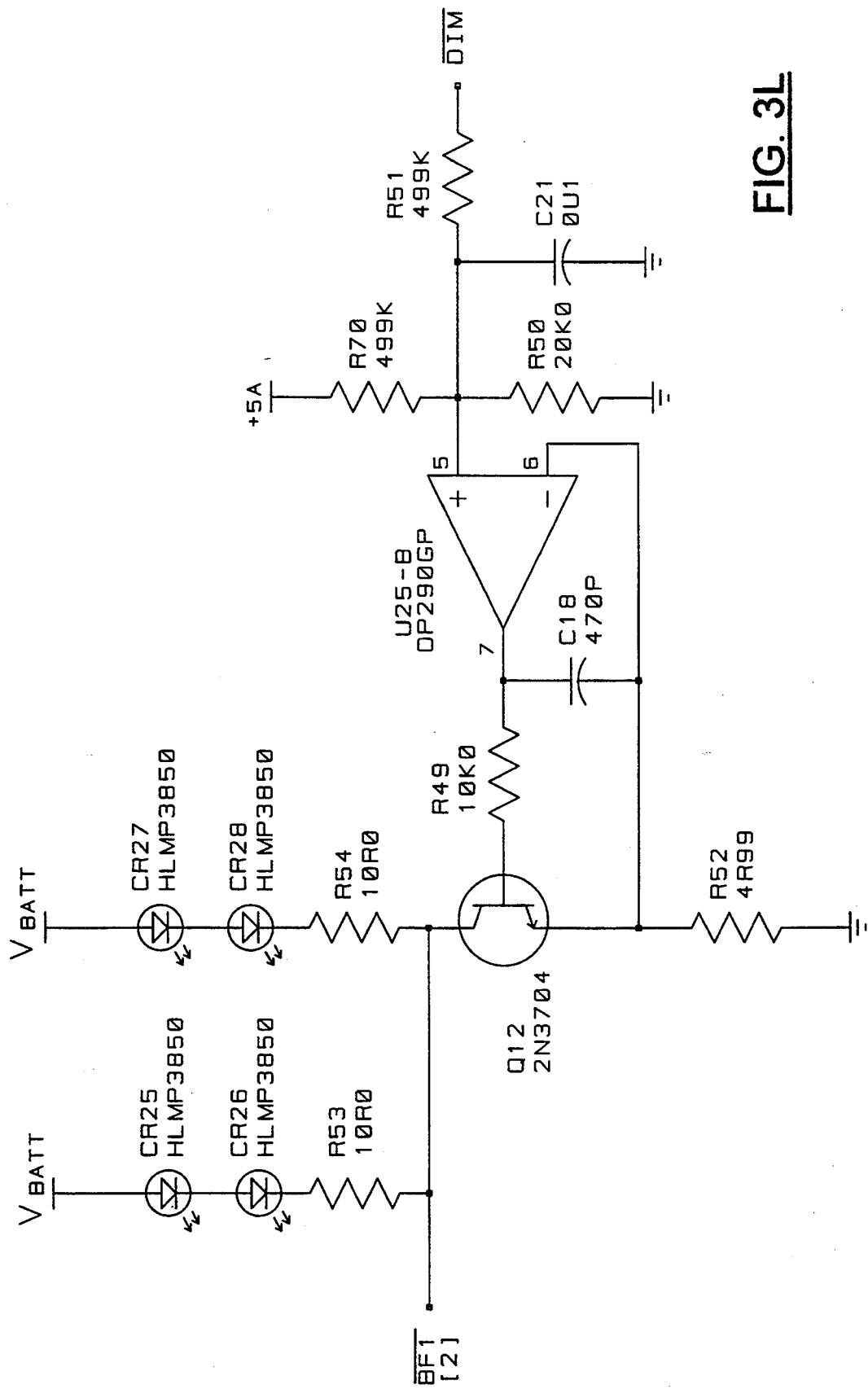
Figure 3M:
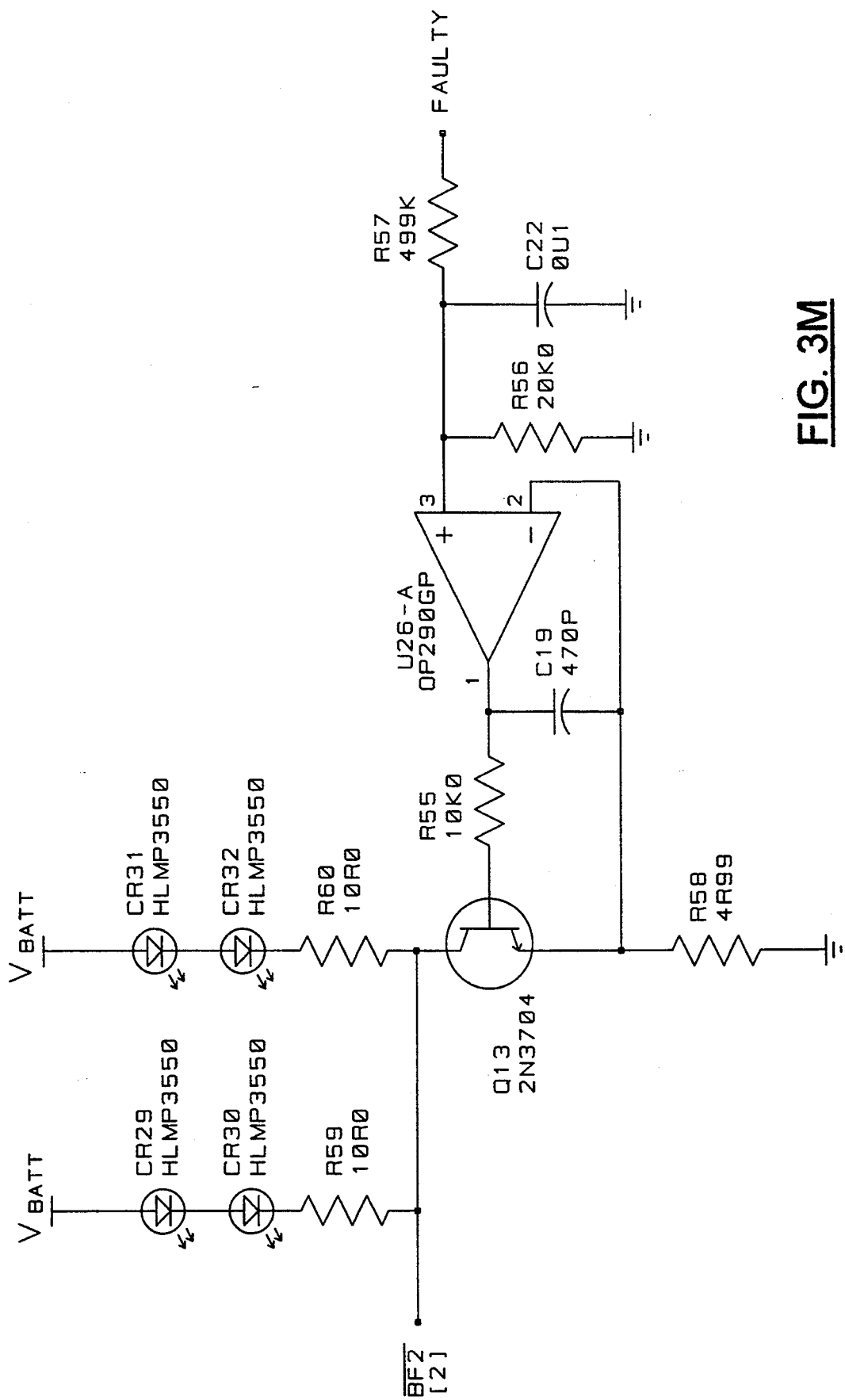
Figure 3N:
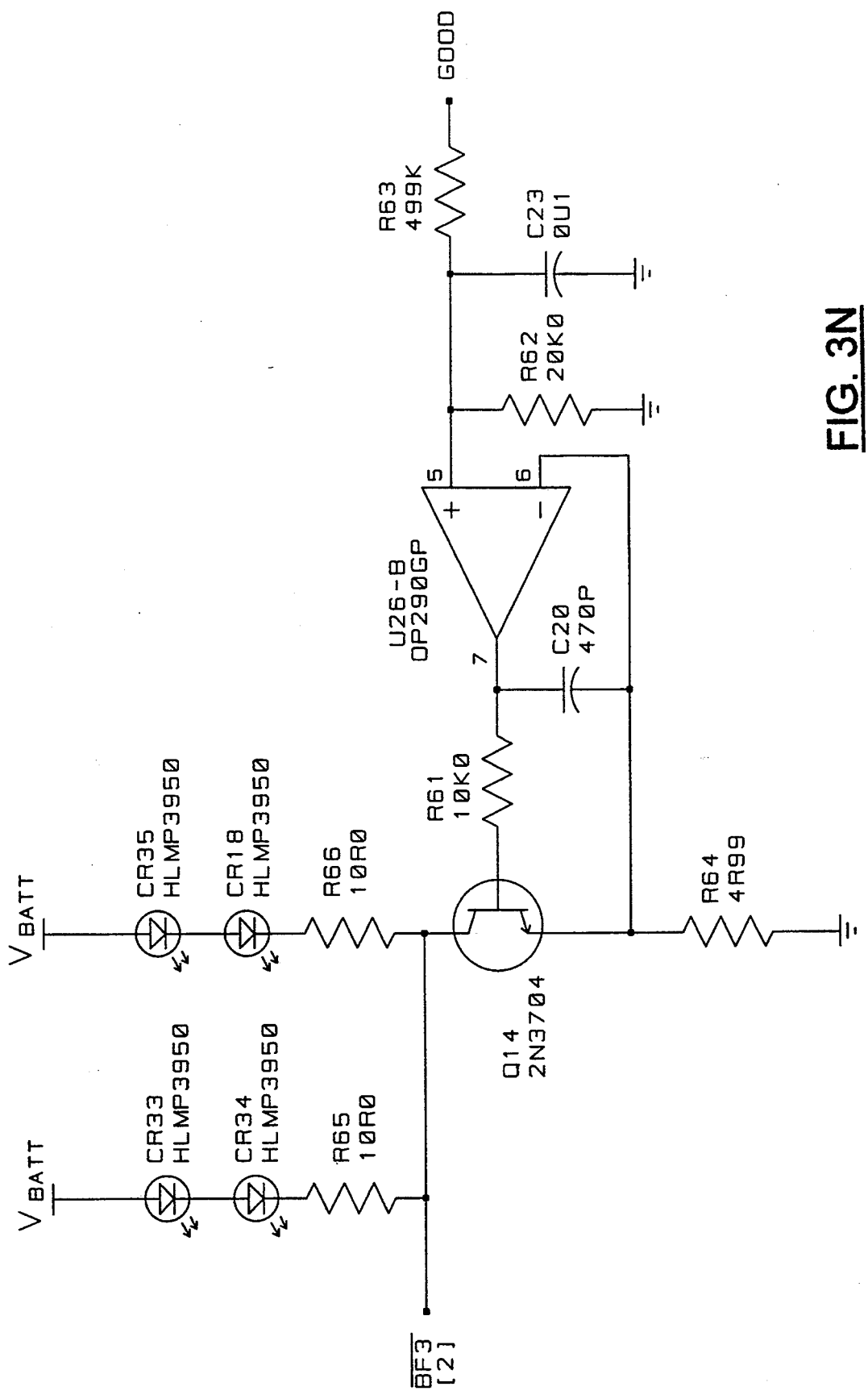
Figure 30:
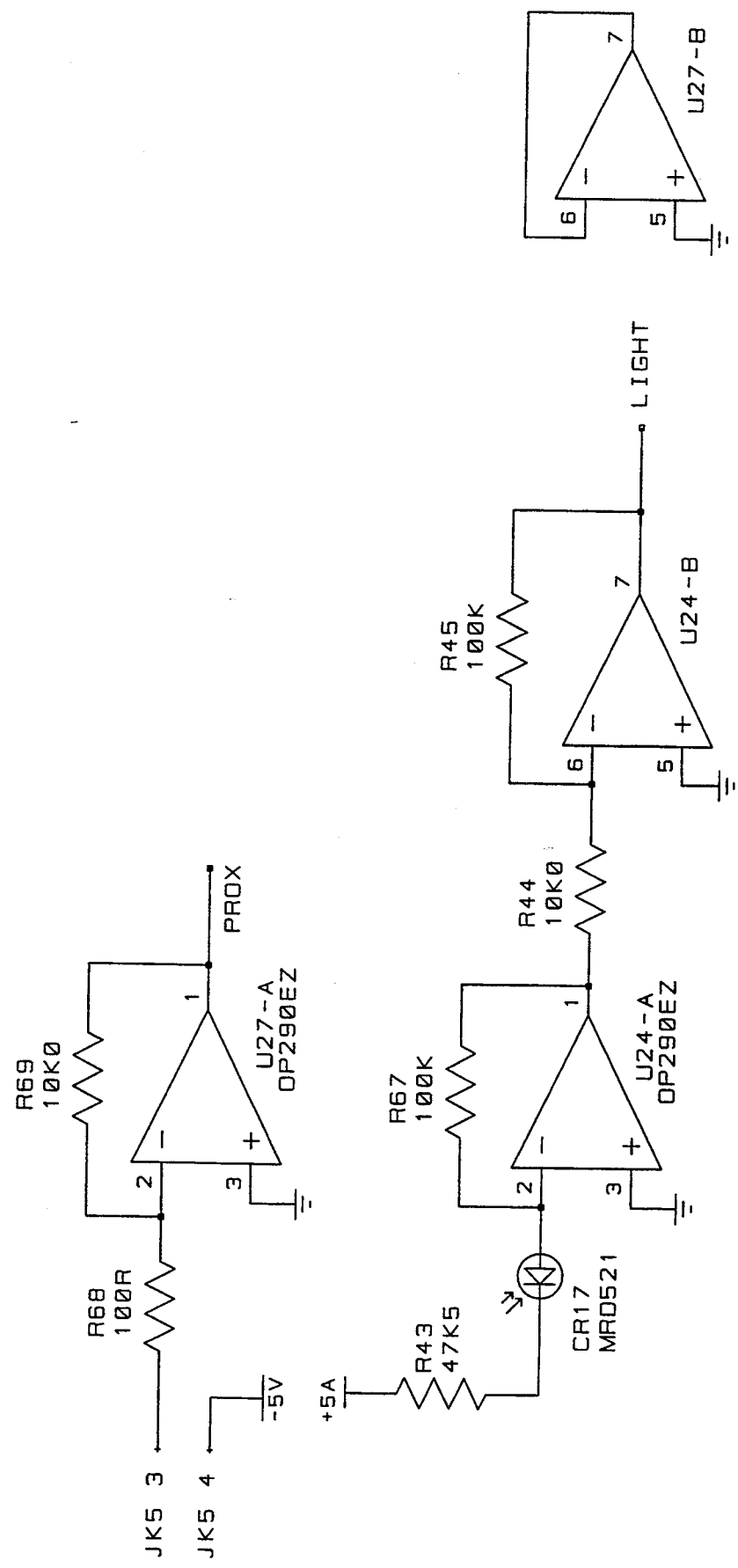

FIG. 1 illustrates a distribution transformer analyzer embodying the subject invention, connected to a dual-secondary transformer. A test power supply supplies a low voltage signal through current shunts and shunt switches to a supply switch selector, which selects between a DC test voltage (preferably 6 V) and one of two AC test voltages (preferably 2 V for testing the low voltage winding and 80 V for testing the high voltage winding) produced by an AC converter. The analyzer thus selectively energizes combinations of the primary and secondary windings through the four test leads using the supply select switches, with minimal battery drain because the duration of each test can be less than one second. The test leads for connection to the low voltage bushings are each provided with separate power and measuring wires, to eliminate the effects of conductor resistance, and all leads are appropriately fused.

The transformer analyzer in a preferred embodiment incorporates the functions of an ohmmeter, ratiometer and impedance meter, controlled by a microprocessor. The measuring circuitry, illustrated in FIG. 2, includes an analog-to-digital (A-D) converter, a scaling circuit, an AC-DC converter, shunts for measuring currents and a switching network. The microprocessor conventionally sets all switches and iteratively adjusts scales to obtain the most accurate reading for any selected test, and the A-D converter output is passed directly to the microprocessor for processing.

FIG. 3 schematically illustrates the digital components of the transformer analyzer circuitry. The microprocessor is connected to the output and input multiplexers that allow for data entry and control of the analogue functional blocks. The switch configurations are determined by registers loaded from the output bus. Data from the A-D converter is routed through the input bus.

The several operator interface input/output devices include a small keypad for scan-list type data entry, requiring no more than 5 keys. For example, the operator could scan through a list of transformer kVA sizes using "up" and "down" scan keys, and select the appropriate size using an "enter" key. The preferred data scan-list is as follows:

Primary Voltages: 19.92, 16, 14.4, 13.86, 12.42, 8.32, 8, 7.2, 4.8, 2.4 kV
Secondary Voltages: 600, 550, 347, 240/120, 120 V
kVA ratings: 167, 100, 75, 50, 37.5, 25, 15, 10, 5, 3 kVA
Nameplate impedance (optional): 1.5% to 4.5% in 0.1% increments
Load: Connected, Not Connected All programming, scan-lists and pass fail criteria are contained in a single ROM chip, which can be easily replaced to upgrade, expand or modify the device. The analyzer may optionally include a non-volatile RAM to retain records of tests and test results which, used in conjunction with means for entering transformer system location data and downloading to a larger computer system, could also produce a useful transformer/fuse failure survey instrument.

In use, the operator scans through the scan-lists and enters required data from the transformer nameplate. This can be done on the ground or in the service vehicle. The analyzer is then carried up to the transformer and the test leads are clamped to the designated transformer bushings. The operator then simply depresses the "test" button to initiate a test sequence that will acquire and evaluate all test data, over a period of about 20 seconds. The analyzer output will then indicate a fault/no fault condition through a pass/fail light system, with an optional audible alarm in the case of a fault condition, and may identify the type of fault on a small alpha-numeric display such as a 40 character LCD window.

Initially, the transformer is tested with the secondary load still connected. Therefore the analyzer "load" selector is initially set at "Connected". If the analysis indicates no fault, the transformer is simply re-energized. If the analysis indicates a fault, the secondary load is disconnected for replacement of the transformer. At this point a second analysis may be conducted, with the "load" selector set to "Not Connected". In this configuration the analyzer can use more refined pass/fail criteria to positively confirm the existence of a fault and identify its type. If this second analysis indicates a no fault condition, contrary to the initial analysis, then service personnel must inspect the secondary conductors or service equipment to detect a fault that may have escaped an initial visual inspection.

The method of the present invention will now be described with reference to a transformer having two secondary (low voltage) windings, which is typical of distribution transformers currently in use in North America. For the small minority of transformers having only a single secondary winding, only parameters or data preceded by an asterisk (*) are required to perform the analysis.

CALCULATED TRANSFORMER PARAMETERS

The method of the present invention, in a preferred embodiment, involves calculation of the following transformer parameters:

Winding Resistances

* $R_{HW}$ = High voltage winding resistance [Ω]
* $R_{SW1}$ = Secondary winding resistance between terminals $X_1$ and $X_2$ [Ω]
$R_{SW2}$ = Secondary winding resistance between terminals $X_3$ and $X_2$ [Ω]
$R_{SW3}$ = Secondary winding resistance between terminals $X_1$ and $X_3$ [Ω]

Winding Ratios

* $N_{p1}$ = Primary to secondary ($X_1$-$X_2$) ratio [per unit of nominal ratio]
$N_{p2}$ = Primary to secondary ($X_2$-$X_3$) ratio [per unit of nominal ratio]
* $N_{ps1}$ = Secondary ($X_1$-$X_2$) to primary ratio [per unit of nominal ratio ]
$N_{ps2}$ = Secondary ($X_2$-$X_3$) to primary ratio [per unit of nominal ratio ]
$N_{s12}$ = Secondary ($X_1$-$X_2$) to secondary ($X_2$-$X_3$) ratio [per unit]
$N_{s21}$ = Secondary ($X_3$-$X_2$) to secondary ($X_1$-$X_2$) ratio [per unit]
$N_{s23}$ = Secondary ($X_3$-$X_2$) to secondary ($X_1$-$X_3$) ratio [per unit ]
* $K_{N1}$ = Primary to secondary ($X_1$-$X_2$) ratio balance
$K_{N2}$ = Primary to secondary ($X_3$-$X_2$) ratio balance
$K_{NS}$ = ($X_1$-$X_2$) to ($X_2$-$X_3$) ratio balance

Transformer Impedances

* $Z_{MP}$ = Shunt impedance measured from the primary [p.u. of base impedance]
* $Z_{MS1}$ = Shunt impedance from the ($X_1$-$X_2$) secondary [p.u. of base impedance]
$Z_{MS2}$ = Shunt impedance from the ($X_3$-$X_2$) secondary [p.u. of base impedance]
* $K_{Z1}$ = Impedance balance between the primary and the ($X_1$-$X_2$) secondary
$K_{Z2}$ = Impedance balance between the primary and the ($X_3$-$X_2$) secondary
$K_{ZS}$ = Impedance balance between the ($X_1$-$X_2$) and the ($X_3$-$X_2$) secondaries

REQUIRED DATA

The raw data required to be measured in order to calculate these transformer parameters is as follows:

$V_{pdc}$ = DC voltage applied to the high voltage winding [V]
$I_{pdc}$ = DC current flowing as a result of voltage application $V_{pdc}$ [A]
$V_{1dc}$ = DC voltage applied to the $X_1$-$X_2$ secondary winding [V]
$V_{2dc}$ = DC voltage applied to the $X_3$-$X_2$ secondary winding [V]
$I_{1dc}$ = DC current flowing as a result of voltage application $V_{1dc}$ [A]
$I_{2dc}$ = DC current flowing as a result of voltage application $V_{2dc}$ [A]
$V_p$ = Test voltage applied to the high voltage winding [V]
$I_p$ = Current flowing into the winding as a result of $V_p$ [A]
$\theta_T$ = Angular displacement of $I_p$ [deg]
$V_{sp1}$ = Voltage between secondary terminals $X_1$ and $X_2$ due to $V_p$ [V]
$V_{sp2}$ = Voltage between secondary terminals $X_3$ and $X_2$ due to $V_p$ [V]
$V_{s1}$ = Test voltage applied between secondary terminals $X_1$ and $X_2$ [V]
$I_{s1}$ = Current flowing into the winding as a result of $V_{s1}$ [A]
$V_{ps1}$ = Voltage across the high voltage winding due to $V_{s1}$ [V]
$V_{s2}$ = Test voltage applied between secondary terminals $X_3$ and $X_2$ [V]
$I_{s2}$ = Current flowing into the winding as a result of $V_{s2}$ [A]
$V_{ps2}$ = Voltage across the high voltage winding due to $V_{s2}$ [V]

FIGS. 8 and 9 illustrate relay contact positions for measuring each of these values.

The following transformer parameters are determined from nameplate data:

$V_{HR}$ = Voltage rating of the high voltage winding [kV] (in case of transformers with multiple taps, this is the currently selected tap)

$V_{SR}$ = Principal voltage rating of the secondary winding [V] (120 V for 240/120 V secondaries)

$V_{SV}$ = Combined voltage rating of all secondary windings [V] (240 V for 240/120 V secondaries, for all other cases $V_{SV} = V_{SR}$)

$P_{AR}$ = Apparent power rating of the transformer [kVA]

and as an optional feature:

$Z_{L\%}$ = Leakage impedance of the transformer [%]

Based on the input of transformer nameplate data prior to testing, the analyzer calculates the following data:

$Z_B$ = Base impedance of the transformer [Ω]
$N_1$ = Principal ratio of the transformer
$N_3$ = Ratio of combined secondaries $$Z_B = \frac{1000 \times V_{HR}^2}{P_{AR}}$$

$$N_1 = \frac{1000 \times V_{HR}}{V_{SR}}$$

$$N_3 = \frac{1000 \times V_{HR}}{V_{SV}}$$

I. WINDING RESISTANCE

Resistances are calculated from the raw data using Ohm's Law. Since resistance varies substantially as between transformers of different manufacturers, and is not provided on the transformer nameplate, a comparison can be made to upper and lower limits as provided in the table of FIG. 6.

Determining secondary winding resistance is somewhat more complicated, because resistance must be determined from each leg of the secondary, but the same general approach of determining resistance limits from the specified transformer impedance is followed. The presence of a load on the secondary has no effect on the DC resistance measurements in the primary, but the load resistance will appear in parallel with the secondary winding resistance.

However, even in the most extreme cases the load resistance is unlikely to be less than four times the maximum resistance of the secondary winding, which is typically in the range of a fraction of an ohm. Since the test instrument might only be capable of measuring resistances above 50 mΩ, the utility of this measurement is limited to detecting open winding conditions by ascertaining that the total resistance is less than, for example, 25% of the minimum load resistance. Thus, a faulty transformer is identified by the following criterion:

IF $R_{SL} > 50$ mΩ THEN $R_{SW1} > R_{SL}$ or $R_{SW2} > R_{SL}$

IF $R_{SL} < 50$ mΩ THEN $R_{SW1} > 0.5 Z_B/N_{12}$ or $R_{SW2} > 0.5 Z_B/N_{12}$

II. WINDING RATIOS

The transformer ratio is defined as the ratio of high voltage winding turns to low voltage winding turns. It is measured with no load on the transformer, by exciting one winding to its rated voltage and measuring the output voltage on the others. In a fault-free transformer, this measurement should be within ±0.5% of the nameplate data. This requires a voltage measurement accuracy greater than ±0.1%, which may be difficult to attain in a field instrument.

The transformer ratio parameters are determined from the raw data using the following equations:

$$N_{p1} = \frac{V_p}{V_{sp2}}$$

$$N_{p2} = \frac{V_p}{V_{sp2}}$$

$$N_{p3} = \frac{V_p}{V_{sp3}}$$

$$N_{ps1} = \frac{V_{ps1}}{V_{s1}}$$

$$N_{ps2} = \frac{V_{ps2}}{V_{s2}}$$

$$K_{N1} = \frac{N_{p1}}{N_{ps1}}$$

$$K_{N2} = \frac{N_{p2}}{N_{ps2}}$$

$$K_{NS} = \frac{N_{ps1}}{N_{ps2}}$$

Based on an assumed instrument accuracy of ±0.25%, the total transformer ratio error is the allowable ratio error (0.5%) plus the instrument error for each voltage measurement (2×0.25%), or ±1%. The maximum allowable ratio balance error is four times the instrument error, or ±1%.

For a transformer disconnected from its secondary load:

(i) The criterion to detect a faulty transformer by individual secondary winding ratios is:

$N_{p1}(N_{p2}, N_{ps1}, N_{ps2}) > 1.01 \times N_1$ or $N_{p1}(N_{p2}, N_{ps1}, N_{ps2}) < 0.99 \times N_1$ (ii) The criterion to detect a faulty transformer by the ratio balances is:

$K_{N1}(K_{N2}, K_{NS}) > 1.01$ or $K_{N1}(K_{N2}, K_{NS}) < 0.99$

The presence of a load on the secondary produces a voltage drop on the transformer leakage impedance, which affects the apparent ratio. For a transformer connected to its secondary load:

(i) The criterion to detect a faulty transformer by individual secondary winding ratios is:

$N_{p1}(N_{p2}) > 1.17 \times N_1$ or $N_{p1}(N_{p2}) < 0.99 \times N_1$ $N_{s1}(N_{s2}) > 1.01 \times N_1$ or $N_{s1}(N_{s2}) < 0.85 \times N_1$ (ii) The criterion to detect a faulty transformer by the ratio balance is:

$K_{N1}(K_{N2}) > 1.32$ or $K_{N1}(K_{N2}) < 0.99$ $K_{NS} > 1.13$ or $K_{NS} < 1.00$

These broad criteria are unlikely to detect many small layer-to-layer faults, and can be narrowed by compensating for transformer and load impedances. To compensate for the effects of transformer and load impedances, the total impedance reflected into the primary terminals of the transformer is computed as follows:

$$Z_T = \frac{V_P P_{AR}}{1000\, V_{HR}^2\, I_P} \times 100$$

where:
$Z_T$=Total impedance [%]
$V_p$=Measured primary voltage [V]
$I_p$=Measured primary current [A]
$V_{HR}$=Primary voltage rating [kV]
$P_{AR}$=Transformer kVA rating [kVA]

Changes in apparent winding ratio and magnetizing impedance are related, because of the equivalent circuit of a faulty transformer, which is illustrated in FIG. 5, where:
$R_P$=Resistance of the primary winding [Ω]
$R_S$=Resistance of the secondary winding [Ω]
$R_F$=Resistance of the faulted winding section [Ω]
$X_P$=Leakage reactance portion assigned to the primary winding [Ω]
$X_S$=Leakage reactance portion assigned to the secondary winding [Ω]
$X_F$=Leakage reactance portion assigned to the faulted winding section [Ω]
$X_M$=Magnetizing reactance of the transformer [Ω]
$R_M$=Resistance representing excitation losses of the transformer [Ω]
$N_T$=Transformer turns ratio From FIG. 6 it will be evident that the faulted winding will appear as a low impedance branch in parallel with the actual magnetizing impedance of the transformer. Thus, the effective magnetizing impedance of the transformer, as measured at the winding terminals, will be lower than for an unfaulted transformer. The effective magnetizing impedance of a faulted transformer is i) Measured from the primary:

$$Z_{MP} = \frac{Z_M \times Z_F}{Z_M + Z_F} + Z_P$$

ii) Measured from the secondary:

$$Z_{MS} = \frac{Z_M \times Z_F}{Z_M + Z_F} + Z_S$$

The apparent ratio measured under these conditions is higher than the actual ratio, because of the voltage drop in the transformer leakage impedance caused by the load current. Since there is no way of determining from the measured data the extent to which the load is balanced, it is necessary to assume the worst case condition for any given parameter.

This compensation can only be applied to ratios measured from the primary. For secondary measurements the following compensating equation is used:

$$N_{px} = \frac{V_p}{V_{sx}} \left| 1 - \frac{Z_{L\%}}{100\, Z_T} \,/\tan^{-1}(K_{XR}) - \theta_T \right|$$

where:
$N_{px}$=Corrected transformer ratio of subscript "x"
$V_s$=Measured secondary voltage of subscript "x" [V]
$Z_{L\%}$=Transformer leakage impedance [%]
$K_{XR}$=X/R ratio of leakage impedance $\theta_T$=Measured or assumed angular displacement of $I_p$ [degrees]

This gives rise to the practical problem of determining the values of $Z_{L\%}$ and $K_{XR}$, because problems of providing a low impedance shorting connection across the secondary terminals cannot be readily solved in a portable instrument. Three options for deriving these parameters are as follows:

(i) The criterion to detect a faulty transformer by individual secondary winding ratios is:

$$N_{p1}(N_{p2}) > 1.11 \times N_1 \text{ or } N_{p1}(N_{p2}) < 1.01 \times N_1$$

$$N_{s1}(N_{s2}) > 1.01 \times N_1 \text{ or } N_{s1}(N_{s2}) < 0.85 \times N_1$$

(ii) The criterion to detect a faulty transformer by the ratio balances is:

$$K_{N1}(K_{N2}) > 1.26 \text{ or } K_{N1}(K_{N2}) < 0.99$$

$$K_{NS} > 1.13 \text{ or } K_{NS} < 1.00$$

a) Calculation Based on Assumed $Z_{L\%}$, $K_{XR}$, and measured $\theta_T$

The angular displacement of the current into the load through the transformer can be measured directly, but the arrangement will increase significantly the complexity of the measuring system. However, the benefit will be an increased accuracy of the corrected value of the ratio.

The errors of this approach have been evaluated for the extremes of all the parameters using correction factors based on the maximum $K_{XR}$ and $Z_{L\%} = 1.7\%$. The following test criteria have been derived.

(i) The criterion to detect a faulty transformer by individual secondary winding ratios is:

$$N_{p1}(N_{p2}) > 1.07 \times N_1 \text{ or } N_{p1}(N_{p2}) < 1.01 \times N_1$$

$$N_{s1}(N_{s2}) > 1.01 \times N_1 \text{ or } N_{s1}(N_{s2}) < 0.85 \times N_1$$

(ii) The criterion to detect a faulty transformer by the ratio balances is:

$$K_{N1}(K_{N2}) > 1.22 \text{ or } K_{N1}(K_{N2}) < 0.99$$

$$K_{NS} > 1.13 \text{ or } K_{NS} < 1.00$$

b) Calculations Based on Assumed $K_R$, $\theta_T$ and on nameplate specified $Z_{L\%}$ Most transformers in service today include the leakage impedance in the nameplate data. Based on the transformer failure study, the nameplate can be missing or it is illegible in some 20% of all cases. In the remaining 80% of transformers, the value could be determined and input to the tester, increasing somewhat the complexity of the test.

The test criteria are the same as in (a) above.

c) Calculation Based on Assumed $K_{XR}$, measured $\theta_T$ and on nameplate specified $Z_{L\%}$ This is the most complex and also the most accurate method of determining the ratio of a loaded transformer. The test criteria are as follows.

(i) The criterion to detect a faulty transformer by individual secondary winding ratio is:

$N_{p1}(N_{p2}) > 1.03 \times N_1$ or $N_{p1}(N_{p2}) < 1.01 \times N_1$ $N_{s1}(N_{s2}) > 1.01 \times N_1$ or $N_{s1}(N_{s2}) < 0.85 \times N_1$ (ii) The criterion to detect a faulty transformer by the ratio balances is:

$K_{N1}(K_{N2}) > 1.18$ or $K_{N1}(K_{N2}) < 0.99$ $K_{NS} > 1.13$ or $K_{NS} < 1.00$

III. MAGNETIZING IMPEDANCE MEASUREMENT

The impedance parameters of a transformer are given by:

$$Z_{MP} = \frac{V_p}{I_p}$$

$$Z_{MSA1} = \frac{V_{s1}}{I_{s1}} \times N_1^2$$

$$Z_{MSA2} = \frac{V_{s2}}{I_{s2}} \times N_1^2$$

The impedance balance parameters are:

$$Z_{MP} = \frac{Z_{MP}}{Z_{MSA1}}$$

$$K_{Z2} = \frac{Z_{MP}}{Z_{MSA2}}$$

$$K_{ZS} = \frac{Z_{MSA1}}{Z_{MSA2}}$$

A particularly useful criterion for ascertaining certain types of faults, such as layer and turn faults when the secondary load is connected to transformer terminals, is the ratio balance. The winding ratios as determined in the primary and secondary windings should balance, i.e. be substantially equal. The ratio balance is essentially the ratio of the winding ratio measured from the primary (forward) to the winding ratio measured from the secondary (reverse). The ratio balance can be tested under load, and is accordingly quite a useful criterion for transformer analysis.

Magnetizing Impedance (i) The criterion to detect a faulty transformer by the magnetizing impedance is:

$Z_{MP}(Z_{MSA1}, Z_{MSA2}) > 200 \times Z_B$ or
$Z_{MP}(Z_{MSA2}, Z_{MSA2}) < 25 \times Z_B$ (ii) The criterion to detect a faulty transformer by the impedance balance is:

$K_{ZP1}(K_{ZP2}, K_{ZS}) < 0.75$ or $K_{ZP1}(K_{ZP2}, K_{ZS}) > 1.1$

An impedance test on an unloaded transformer will detect all fault conditions except layer bypass or special open winding conditions. As established through failure survey measurements, in a properly working transformer the minimum impedance limit is 25 p.u. of $Z_B$ (4% magnetizing current) and the maximum is 200 p.u. of $Z_B$ (0.5% magnetizing current).

(i) The criterion to detect a faulty transformer by the magnetizing impedance is:

$Z_{MP}(Z_{MSA1}, Z_{MSA2}) > 200 \times Z_B$ or
$Z_{MP}(Z_{MSA1}, Z_{MSA2}) < 25 \times Z_B$ (ii) The criterion to detect a faulty transformer by the impedance balance is:

$K_{ZP1}(K_{ZP2}, K_{ZS}) < 0.75$ or $K_{ZP1}(K_{ZP2}, K_{ZS}) > 1.1$

When the secondary load is still connected, the measured impedances include the load impedance. Thus, impedance values can be as low as 0.25 p.u. of $Z_B$ (base impedance of the transformer) even in a good transformer, due to cold load pickup. The test is still useful since many faulty transformers exhibit impedance values well below this level. However, because of the uncertain disposition of the load, the impedance balances are unlikely to provide a useful indication of the transformers condition.

(i) The criterion to detect a faulty transformer by impedance measurement in the presence of a load is:

$Z_{MP}(Z_{MSA1}, Z_{MSA2}) > 200 \times Z_B$ or
$Z_{MP}(Z_{MSA1}, Z_{MSA2}) < 0.25 \times Z_B$ As in the case of the ratio balance, the impedance balance can be a very useful criterion for determining certain types of fault conditions such as layer and turn faults, with no load connected to the transformer. The impedance balance is calculated in both the forward and reverse directions, i.e. from the perspective of the primary winding and then the secondary winding, and the ratio of these two calculations, the impedance balance, should be approximately one. A different result indicates a fault condition.

Determination of the above criteria and comparison with known values for a fault-free transformer, examples of which are given in FIGS. 6 and 7, will provide a transformer profile which will indicate the fault conditions listed above in most cases of faulty transformers. Combining the comparisons in the three parameters winding resistance, magnetizing impedance and winding ratio increases the accuracy of the analysis to the extent that results will often be corroborative.

The winding ratio balance and the impedance balance each provide a high degree of accuracy in fault analysis, and are useful even apart from other results in determining the presence of a fault; it is nevertheless expected that in most cases a comparative study of all parameters will help to determine the specific fault in any given case.

The invention having thus been described by way of a preferred embodiment, it will be obvious to those skilled in the art that certain modifications and adaptations may be made without departing from the scope of the invention as set out in the appended claims.

We claim:

1. A method of analyzing a transformer having a primary winding and at least one secondary winding utilizing an analyzing apparatus comprising DC and AC power supplies, a voltmeter and an ammeter all selectively connected to test leads, comprising
   attaching the test leads to the terminals of a transformer winding,
   applying a voltage to the primary winding and measuring a voltage output of the secondary winding to calculate a ratio of the number of turns in the primary winding to the number of turns in the secondary winding, applying a voltage to the secondary winding and measuring a voltage output of the primary winding to calculate a ratio of the number of turns in the secondary winding to the number of turns in the primary winding, and comparing the first ratio with the second ratio to determine whether a fault condition exists.

2. A method of analyzing a transformer having a primary winding and at least one secondary winding utilizing an analyzing apparatus comprising DC and AC power supplies, a voltmeter and an ammeter all selectively connected to test leads, comprising attaching the test leads to the terminals of a transformer winding, applying an AC voltage to the primary winding and measuring the resulting primary AC current to calculate the magnetizing impedance of the transformer primary winding, applying an AC voltage to each secondary winding and measuring the resulting secondary AC current to calculate the magnetizing impedance of the transformer secondary windings, and comparing the primary magnetizing impedance to the secondary magnetizing impedance to determine whether a fault condition exists.

3. A method of analyzing a transformer having a primary winding and at least one secondary winding utilizing an analyzing apparatus comprising DC and AC power supplies, a voltmeter and an ammeter all selectively connected to test leads, comprising attaching the test leads to the terminals of a transformer winding, applying a DC voltage to each of the windings in turn and measuring each of the resulting DC currents to calculate the resistance of each of the primary and secondary windings, applying an AC voltage to the primary winding and measuring the resulting primary AC current to calculate the magnetizing impedance of the transformer primary winding, applying an AC voltage to each secondary winding and measuring the resulting secondary AC current to calculate the magnetizing impedance of the transformer secondary windings, applying a voltage to the primary winding and measuring a voltage output of the secondary winding to calculate a ratio of the number of turns in the primary winding to the number of turns in the secondary winding, and applying a voltage to the secondary winding and measuring a voltage output of the primary winding to calculate a ratio of the number of turns in the secondary winding to the number of turns in the primary winding, comparing the calculated values with pre-ascertained values to determine if a fault condition exists and to determine the fault type.

* * * * *